US012607658B2

(12) United States Patent
Gebreyohannes et al.

(10) Patent No.: US 12,607,658 B2
(45) Date of Patent: Apr. 21, 2026

(54) CURRENT SENSOR WITH A TIME-INTERLEAVED IMPEDANCE COMPENSATION SCHEME

(71) Applicant: QUALCOMM Incorporated, San Diego, CA (US)

(72) Inventors: Fikre Tsigabu Gebreyohannes, Midleton (IE); Denis Gaspar Nogueira Da Silva, Cork (IE); Khaled Mohamed Ashraf Elgammal, Cork (IE); Keith Anthony O Donoghue, Carrigaline (IE)

(73) Assignee: QUALCOMM INCORPORATED, San Diego, CA (US)

( * ) Notice: Subject to any disclaimer, the term of this patent is extended or adjusted under 35 U.S.C. 154(b) by 465 days.

(21) Appl. No.: 18/187,540

(22) Filed: Mar. 21, 2023

(65) Prior Publication Data

US 2024/0319240 A1 Sep. 26, 2024

(51) Int. Cl.
*G01R 19/257* (2006.01)

(52) U.S. Cl.
CPC .................................. *G01R 19/257* (2013.01)

(58) Field of Classification Search
CPC .......................... G01R 19/257; G01R 19/0092
See application file for complete search history.

(56) References Cited

U.S. PATENT DOCUMENTS

| | | | |
|---|---|---|---|
| 3,480,852 A | 11/1969 | Han-Min | |
| 3,848,195 A | 11/1974 | Kiko | |

| | | | |
|---|---|---|---|
| 5,166,630 A | 11/1992 | Lee | |
| 5,451,950 A | 9/1995 | Vincelette et al. | |
| 5,691,720 A | 11/1997 | Wang et al. | |

(Continued)

FOREIGN PATENT DOCUMENTS

| | | |
|---|---|---|
| CN | 2580448 Y | 10/2003 |
| CN | 101166016 A | 4/2008 |

(Continued)

OTHER PUBLICATIONS

Fonollosa J., et al., "Calibration Transfer and Drift Counteraction in Chemical Sensor Arrays Using Direct Standardization", Sensors and Actuators B: Chemical, Nov. 29, 2016, 32 Pages.

(Continued)

*Primary Examiner* — Giovanni Astacio-Oquendo
*Assistant Examiner* — Haidong Zhang
(74) *Attorney, Agent, or Firm* — Loza & Loza, LLP

(57) ABSTRACT

A system includes one or more power switches, a replica switch, a current source coupled in series with the replica switch, and a multiplexer having a first input, a second input, a third input, a fourth input, a first output, and a second output, wherein the one or more power switches are coupled between the first input and the second input of the multiplexer, and the replica switch is coupled between the third input and the fourth input of the multiplexer. The system also includes an amplifying circuit having a first input, a second input, and an output, wherein the first input of the amplifying circuit is coupled to the first output of the multiplexer, and the second input of the amplifying circuit is coupled to the second output of the multiplexer. The system also includes an analog-to-digital converter (ADC) coupled to the output of the amplifying circuit.

24 Claims, 13 Drawing Sheets

(56) References Cited

U.S. PATENT DOCUMENTS

| | | | |
|---|---|---|---|
| 5,982,315 | A | 11/1999 | Bazarjani et al. |
| 6,016,047 | A | 1/2000 | Notten et al. |
| 6,032,109 | A | 2/2000 | Ritmiller, III |
| 6,087,888 | A | 7/2000 | Inokuchi |
| 6,166,591 | A | 12/2000 | Schultz et al. |
| 6,369,745 | B1 | 4/2002 | Lee et al. |
| 6,407,623 | B1 | 6/2002 | Bazarjani et al. |
| 6,535,039 | B2 | 3/2003 | Nanba et al. |
| 6,552,579 | B1 | 4/2003 | Knoedgen |
| 6,552,676 | B1 | 4/2003 | Bjorksten et al. |
| 6,614,285 | B2 | 9/2003 | Lee et al. |
| 6,653,886 | B1 | 11/2003 | Lee et al. |
| 6,839,015 | B1 | 1/2005 | Sutardja et al. |
| 6,888,413 | B1 | 5/2005 | Adams et al. |
| 6,956,753 | B1 | 10/2005 | Ananias |
| 6,958,590 | B1 | 10/2005 | Vaananen |
| 6,967,610 | B1 | 11/2005 | Sutardja et al. |
| 7,002,501 | B2 | 2/2006 | Gulati et al. |
| 7,081,789 | B2 | 7/2006 | Klemmer |
| 7,154,291 | B2 | 12/2006 | Turner et al. |
| 7,579,900 | B2 | 8/2009 | Durbaum et al. |
| 7,750,837 | B2 | 7/2010 | Wang et al. |
| 7,982,526 | B2 | 7/2011 | Lee |
| 7,994,766 | B2 | 8/2011 | De Lima Filho et al. |
| 8,035,397 | B1 | 10/2011 | Jaoude et al. |
| 9,000,750 | B2 | 4/2015 | Yu et al. |
| 9,369,043 | B2 | 6/2016 | Couleur et al. |
| 9,444,414 | B2 | 9/2016 | Peluso |
| 9,494,957 | B2 | 11/2016 | Price et al. |
| 9,903,892 | B2 | 2/2018 | Zhang et al. |
| 11,047,946 | B2 | 6/2021 | Dang et al. |
| 2002/0163991 | A1 | 11/2002 | Stessman |
| 2004/0085135 | A1 | 5/2004 | Jaehne et al. |
| 2005/0206455 | A1 | 9/2005 | Yamazaki et al. |
| 2006/0083389 | A1 | 4/2006 | Oxford et al. |
| 2006/0125463 | A1 | 6/2006 | Yen et al. |
| 2007/0152752 | A1 | 7/2007 | Oishi |
| 2007/0188219 | A1 | 8/2007 | Segarra |
| 2008/0143184 | A1 | 6/2008 | Otsuga et al. |
| 2008/0284406 | A1 | 11/2008 | Kapusta, Jr. |
| 2011/0095818 | A1 | 4/2011 | Sullivan |
| 2011/0227772 | A1 | 9/2011 | Maurino |
| 2012/0153917 | A1 | 6/2012 | Adell et al. |
| 2012/0283970 | A1 | 11/2012 | Boehm |
| 2014/0191772 | A1 | 7/2014 | Hetzler |
| 2016/0111958 | A1 | 4/2016 | Choi et al. |
| 2016/0320446 | A1* | 11/2016 | Huang ................... G01R 21/00 |
| 2016/0380595 | A1 | 12/2016 | Finlinson et al. |
| 2018/0048324 | A1 | 2/2018 | Samad et al. |
| 2018/0167077 | A1 | 6/2018 | Tsai |
| 2019/0212704 | A1 | 7/2019 | Mahajan et al. |
| 2021/0408969 | A1* | 12/2021 | Bang ................... H03F 1/0227 |
| 2022/0065901 | A1 | 3/2022 | Desai et al. |
| 2022/0357375 | A1* | 11/2022 | Angelini ............ G01R 19/0092 |

FOREIGN PATENT DOCUMENTS

| | | | |
|---|---|---|---|
| CN | 201364356 | Y | 12/2009 |
| CN | 104067134 | B | 10/2016 |
| CN | 106053915 | A | 10/2016 |
| CN | 106324545 | A | 1/2017 |
| CN | 106370912 | A | 2/2017 |
| EP | 1168603 | A1 | 1/2002 |
| EP | 2042879 | A1 | 4/2009 |
| GB | 201120295 | | 1/2012 |
| JP | 63006908 | A | 1/1988 |
| JP | 2000338146 | A | 12/2000 |
| JP | 2002223137 | A | 8/2002 |
| JP | 2006074084 | A | 3/2006 |
| JP | 2008506337 | A | 2/2008 |
| TW | 200640135 | A | 11/2006 |
| TW | 201636624 | A | 10/2016 |
| WO | 2006017202 | A1 | 2/2006 |
| WO | 2008137654 | A1 | 11/2008 |
| WO | 2016007316 | A1 | 1/2016 |
| WO | 2016039858 | A1 | 3/2016 |

OTHER PUBLICATIONS

Jun-Feng L., "Research of Harmonic Current Detection Method Based on Lead Network", Power Electronics Technology, vol. 44, No. 9, Sep. 30, 2019, 2 Pages.

Jun-Jie Q., et al., "Applications of Rogowski Coil in Common-mode Current Measurement of High Voltage Inverter", Journal of Electric Power System and Its Automation, Issue 04, vol. 22, Aug. 15, 2010, 6 Pages.

Yanhui H., et al., "Design of High-Accuracy LVDT Simulator based on Amplitude-Frequency Calibration", Computer Measurement and Control, Jul. 31, 2016, 4 Pages.

Anderson, et al., "A Cost-Efficient High-Speed 12-bit Pipeline ADC in 0.18-"m Digital CMOS," IEEE Journal of Solid-State Circuits, Jul. 2005, vol. 40, No. 7, pp. 1506-1513.

"APSPA Arbitrary Pulsed Semiconductor Parameter Analyzer", APSPA User's Manual, XX, XX, Jul. 3, 1998, XP002270247, figure 12, 89 pages.

Huang, H.W., et al., "A IV 16.9ppm/AC 250nA Switched-Capacitor CMOS Voltage Reference," Solid-State Circuits Conference, 2008. ISSCC 2008. Digest of Technical Papers. IEEE International, vol. pp. 438,626, Feb. 3-7, 2008.

Kayal M., et al., "Automatic Calibration of Hall Sensor Microsystems", Microelectronics Journal, Mackintosh Publications Ltd. Luton, GB, vol. 37, No. 12, Dec. 1, 2006, pp. 1569-1575, XP028078992, ISSN: 0026-2692, DOI: 10.1016/J.MEJO.2006.04.013 [retrieved on Dec. 1, 2006], figures 1, 2, 5, 6.

Laughton., et al., "Electrical Engineer's Reference Book", ISBN 978-0-7506-1202-9, 16th Edition, chapter 12 & amp; chapter 13 (Year: 2003), 103 pages.

Ndjountche, T., et al., "Programmable canonical switched-capacitor bump equaliser architecture," Circuits, Devices and Systems, IEEE Proceedings-, vol. 145, No. 4, pp. 285, 288,—Aug. 1998.

Torelli, G., et al., "Tracking switched-capacitor CMOS current reference," Circuits, Devices and Systems, IEEE Proceedings-, vol. 145, No. 1, pp. 44, 47, Feb. 1998.

Tu C.C., et al., "A Low-Noise Area-Efficient Chopped VCO-Based CTDSM for Sensor Applications in 40-nm CMOS", IEEE Journal of Solid-State Circuits, IEEE Service Center, Piscataway, NJ, USA, vol. 52, No. 10, Oct. 1, 2017, XP011661122, ISSN: 0018-9200, DOI: 10.1109/JSSC.2017.2724025 [retrieved on Sep. 21, 2017], figure 6, pp. 2523-2532.

Taiwan Search Report—TW112125547—TIPO—Sep. 23, 2023.

* cited by examiner

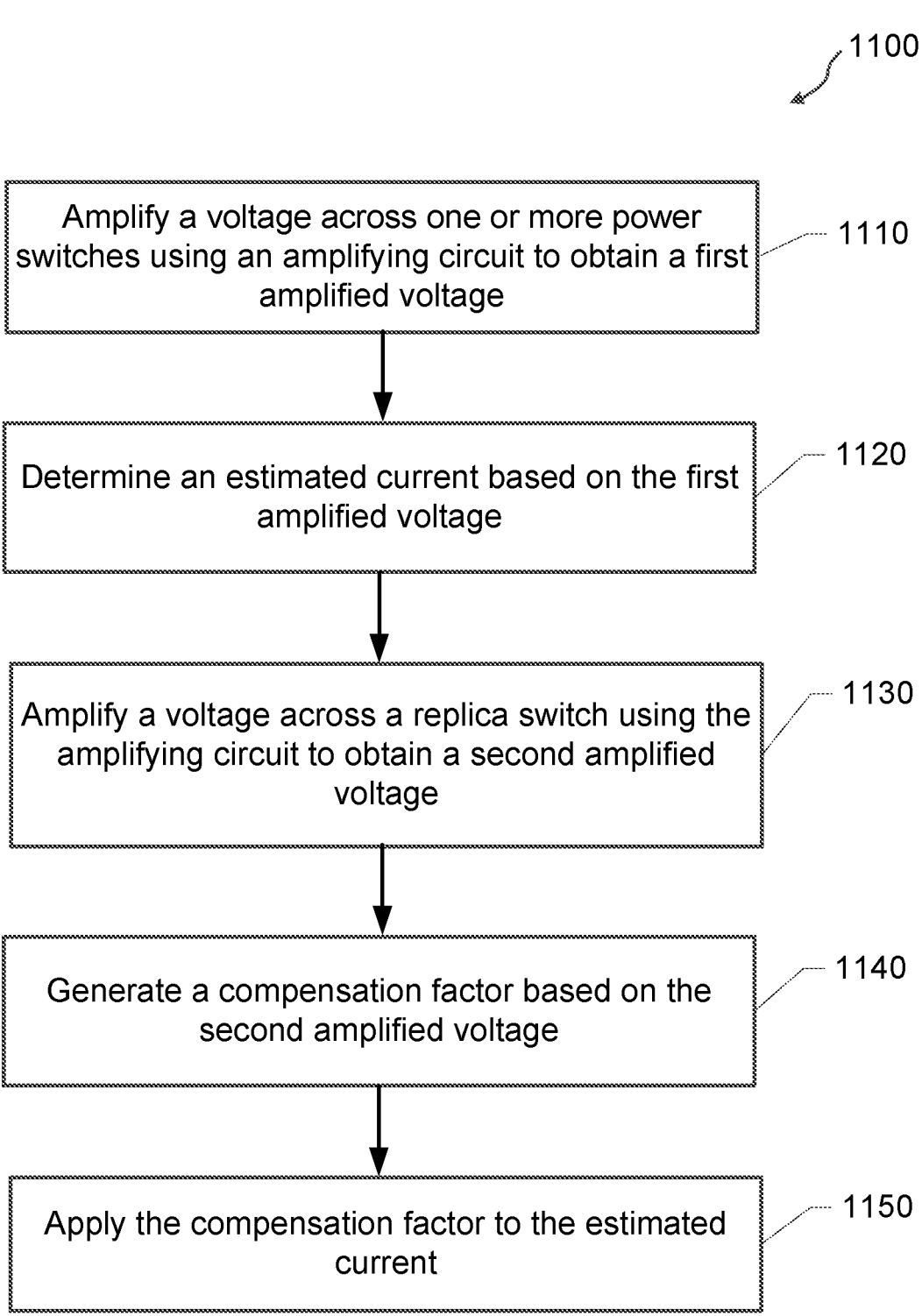

1100

Amplify a voltage across one or more power switches using an amplifying circuit to obtain a first amplified voltage — 1110

Determine an estimated current based on the first amplified voltage — 1120

Amplify a voltage across a replica switch using the amplifying circuit to obtain a second amplified voltage — 1130

Generate a compensation factor based on the second amplified voltage — 1140

Apply the compensation factor to the estimated current — 1150

FIG. 11

CURRENT SENSOR WITH A TIME-INTERLEAVED IMPEDANCE COMPENSATION SCHEME

BACKGROUND

Field

Aspects of the present disclosure relate generally to current sensing, and, more particularly, to current sensing with time-interleaved impedance compensation.

Background

A system on a chip (SoC) may include various circuits including one or more processing cores. The SoC may also include many power switches (e.g., thousands of power switches) distributed over a large area of the chip to control power to the one or more processing cores from an external voltage source. The SoC may also include a current-sensing circuit configured to sense current flow to the one or more processing cores, and a current management circuit configured to manage current to the one or more processing cores based on the sensed current.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes one or more power switches, a replica switch, and a current source coupled in series with the replica switch. The system also includes a multiplexer having a first input, a second input, a third input, a fourth input, a first output, and a second output, wherein the one or more power switches are coupled between the first input of the multiplexer and the second input of the multiplexer, and the replica switch is coupled between the third input of the multiplexer and the fourth input of the multiplexer. The system also includes an amplifying circuit having a first input, a second input, and an output, wherein the first input of the amplifying circuit is coupled to the first output of the multiplexer, and the second input of the amplifying circuit is coupled to the second output of the multiplexer. The system further includes an analog-to-digital converter (ADC) having an input and an output, wherein the input of the ADC is coupled to the output of the amplifying circuit.

A second aspect relates to a method for current sensing. The method includes amplifying a voltage across one or more power switches using an amplifying circuit to obtain a first amplified voltage, and determining an estimated current based on the first amplified voltage. The method also includes amplifying a voltage across a replica switch using the amplifying circuit to obtain a second amplified voltage, wherein the replica switch is coupled in series with a current source. The method also includes generating a compensation factor based on the second amplified voltage, the compensation factor compensating for a change in a resistance of the one or more power switches. The method also includes applying the compensation factor to the estimated current.

A third aspect relates to an apparatus for current sensing. The apparatus includes means for amplifying a voltage across one or more power switches to obtain a first amplified voltage, means for determining an estimated current based on the first amplified voltage, means for amplifying a voltage across a replica switch to obtain a second amplified voltage, wherein the replica switch is coupled in series with a current source, means for generating a compensation factor based on the second amplified voltage, the compensation factor compensating for a change in a resistance of the one or more power switches, and means for applying the compensation factor to the estimated current.

BRIEF DESCRIPTION OF THE DRAWINGS

FIG. 11 is a flowchart illustrating a method for current sensing according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A system on a chip (SoC) may include various circuits including one or more processing cores. The one or more processing cores may include one or more central processing unit (CPU) cores, one or more graphics processing unit (GPU) cores, one or more neural signal processing (NSP) cores, and the like. The SoC may also include many power switches (e.g., thousands of power switches) distributed over a large area of the chip to control power to the one or more processing cores from an external voltage source (e.g., a battery and/or a power management integrated circuit (PMIC)). The power switches may also be referred to as head switches, block head switches, globally distributed or grid-distributed head switches (GDHS), or another term.

The SoC may also include a current-sensing circuit configured to sense current flow to the one or more processing cores, and a current management circuit configured to manage current to the one or more processing cores based on sensed current. For example, the current management circuit may monitor the current flowing to the one or more processing cores using the current-sensing circuit to make sure the current does not become too large. For example, if the sensed current approaches or exceeds a current limit, then the current management circuit may take steps to reduce the current such as reducing the clock frequency of the one or more cores.

Figure 1:
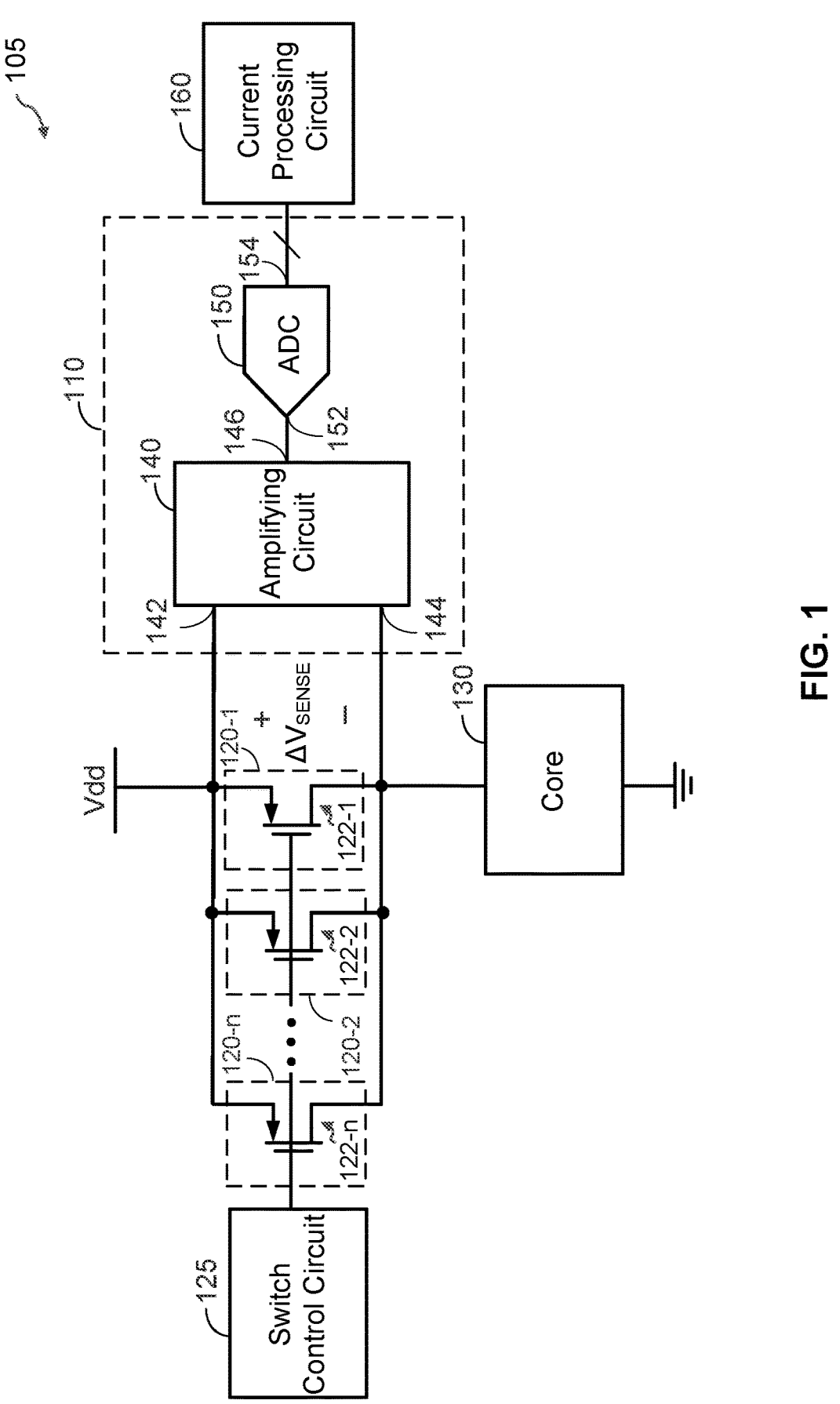
FIG. 1 shows an example of a system including power switches and a current-sensing circuit according to certain aspects of the present disclosure.

A current-sensing circuit may sense the current flow to one or more cores by sensing the current flowing through power switches coupled to the one or more cores. In this regard, FIG. 1 shows an example of a system 105 (e.g., SoC) including a current-sensing circuit 110 configured to sense the current flowing through power switches 120-1 to 120-$n$ (e.g., GDHS) coupled to a core 130. The current-sensing circuit 110 may also be referred to as a current sensor or another term. Although one core 130 is shown in FIG. 1, it is to be appreciated that the power switches 120-1 to 120-$n$ may supply current to a single core or multiple cores.

In this example, the power switches 120-1 to 120-$n$ may be coupled between a power grid (also referred to as a power distribution network) and the core 130. The power switches 120-1 to 120-$n$ may be distributed at different nodes on the power grid.

The on/off states of the power switches 120-1 to 120-$n$ may be controlled by a switch control circuit 125. For example, the switch control circuit 125 may turn on the power switches 120-1 to 120-$n$ when the core 130 is active and turn off the power switches 120-1 to 120-$n$ when the core 130 is inactive. In the example shown in FIG. 1, each of the power switches 120-1 to 120-$n$ is implemented with a respective p-type field effect transistor (PFET) 122-1 to 122-$n$, in which the gates of the PFETs 122-1 to 122-$n$ are coupled to the switch control circuit 125. In this example, the switch control circuit 125 may turn on the power switches 120-1 to 120-$n$ by pulling the gates of the respective PFETs 122-1 to 122-$n$ low, and turn off the power switches 120-1 to 120-$n$ by pulling the gates of the respective PFETs 122-1 to 122-$n$ high. However, it is to be appreciated that the power switches 120-1 to 120-$n$ are not limited to PFETs. In some implementations, the system 105 may include buffers (not shown) between the gates of the power switches 120-1 to 120-$n$.

In this example, the current-sensing circuit 110 includes an amplifying circuit 140 and an analog-to-digital converter (ADC) 150. The amplifying circuit 140 has a first input 142, a second input 144, and an output 146. The ADC 150 has an input 152 coupled to the output 146 of the amplifying circuit 140, and an output 154 coupled to a current processing circuit 160.

The power switches 120-1 to 120-$n$ are coupled between the first input 142 and the second input 144 of the amplifying circuit 140. As a result, the amplifying circuit 140 senses the current-resistor (IR) voltage drop (labeled "$\Delta V_{SENSE}$") across the power switches 120-1 to 120-$n$. For the example where the power switches 120-1 to 120-$n$ are implemented with the PFETs 122-1 to 122-$n$, the sources of the PFETs 122-1 to 122-$n$ are coupled to the first input 142, and the drains of the PFETs 122-1 to 122-$n$ are coupled to the second input 144.

The amplifying circuit 140 amplifies the sensed voltage, and outputs the amplified sensed voltage at the output 146. The ADC 150 receives the amplified sense voltage at the input 152, and converts the amplified sensed voltage into a digital signal indicating the sensed voltage. The ADC 150 outputs the digital signal to the current processing circuit 160, which processes the digital signal in the digital domain.

In this example, the current processing circuit 160 may estimate the current following through the power switches 120-1 to 120-$n$ to the core 130 based the sensed voltage indicated by the digital signal using Ohm's law. For example, the current processing circuit 160 may estimate the current flowing through the power switches 120-1 to 120-$n$ based on the sensed voltage divided by the resistance of the power switches 120-1 and 120-$n$. Since the estimated current depends on the resistance of the power switches 120-1 to 120-$n$, variation in the resistance of the power switches 120-1 to 120-$n$ due to process, voltage and/or temperature (PVT) variation can introduce significant errors in the estimated current. For example, PVT variation may include supply voltage variation, in which the resistance of power switches 120-1 to 120-$n$ is sensitive to changes in the supply voltage (labeled "Vdd" in FIG. 1).

Because of variation in the resistance of the power switches 120-1 to 120-$n$ due to PVT variation, the current processing circuit 160 may not be able to distinguish between changes in the sensed voltage due to changes in the current flowing to the core 130 or changes in the sensed voltage due to variation in the resistance (i.e., impedance) of the power switches 120-1 to 120-$n$ due to PVT variation (e.g., supply voltage variation). As a result, the accuracy of the current sensing is compromised. Accordingly, a compensation scheme for compensating for variation in the resistance (i.e., impedance) of the power switches 120-1 to 120-$n$ due to PVT variation is desirable to provide a more accurate measurement of the current flowing to the core 130.

Aspects of the present disclosure provide impedance compensation in which a change in the resistance (i.e., impedance) of the power switches 120-1 to 120-$n$ due to PVT variation is estimated using a replica power switch. A compensation factor (i.e., compensation gain) is generated based on the estimated change in the resistance (i.e., impedance), and the compensation factor is applied to the estimated current to compensate for the change in the resistance (i.e., impedance). These aspects and other aspects of the present disclosure are discussed further below.

Figure 2:
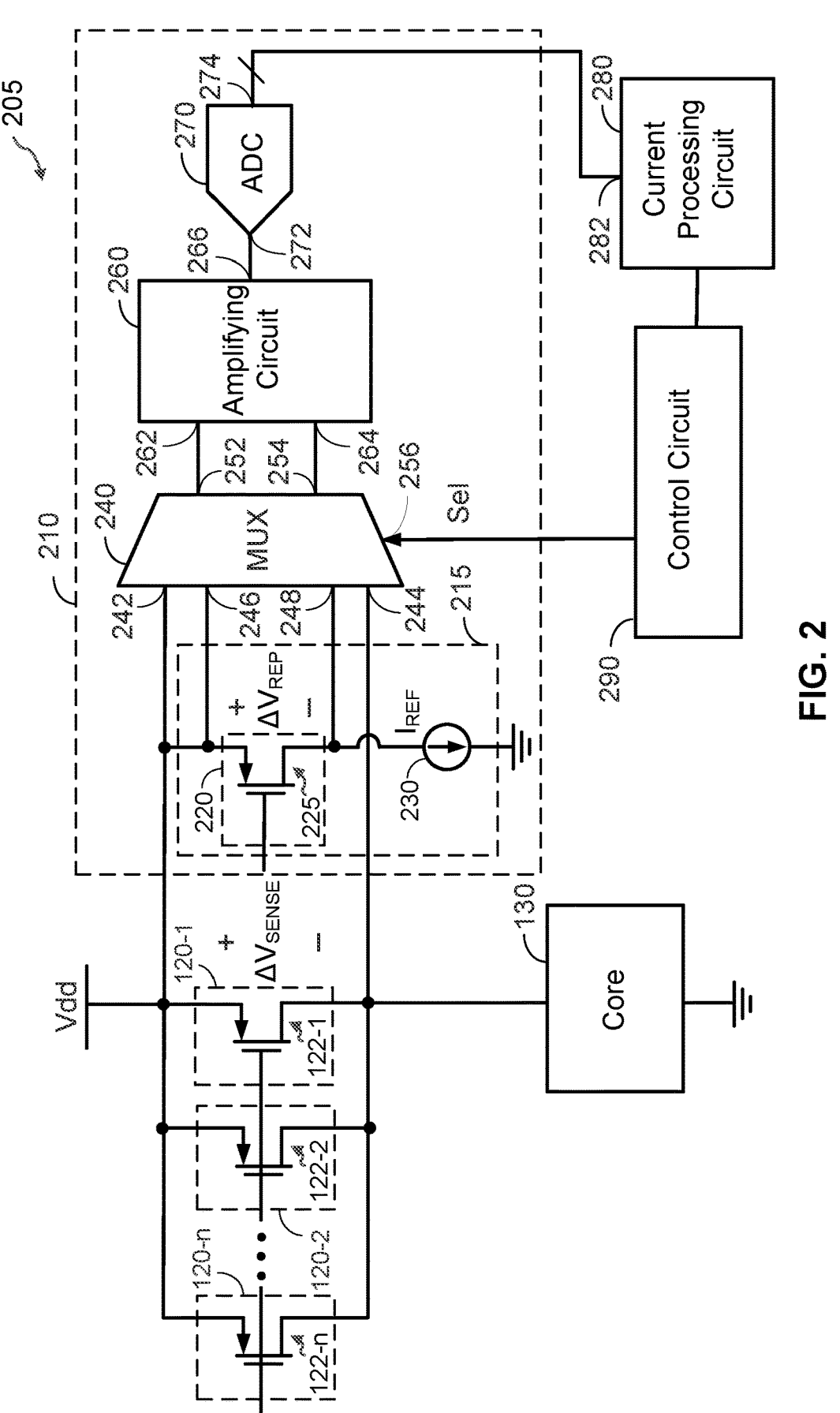
FIG. 2 shows an example of a current-sensing circuit with impedance compensation according to certain aspects of the present disclosure.

FIG. 2 illustrates an example of a system 205 including a current-sensing circuit 210 according to certain aspects of the present disclosure. In this example, the current-sensing circuit 210 includes a resistance-sensing circuit 215 for measuring a change in switch resistance (i.e., impedance) due to PVT variation. The current-sensing circuit 210 also includes a multiplexer 240, an amplifying circuit 260, and an analog-to-digital converter (ADC) 270. In certain aspects, the amplifying circuit 260 is implemented with a switched-capacitor amplifier, as discussed further below. The amplifying circuit 260 has a first input 262, a second input 264, and an output 266. The ADC 270 has an input 272 coupled to the output 266 of the amplifying circuit 260, and an output 274 coupled to an input 282 of a current processing circuit 280. The ADC 270 may be implemented with a successive approximation register (SAR) ADC or another type of ADC.

The resistance-sensing circuit 215 includes a replica switch 220 and a reference current source 230 coupled in series with the replica switch 220. The replica switch 220 may be an instance (i.e., copy) of one of the power switches 120-1 to 120-n. In some implementations, the replica switch 220 may be a scaled up version or a scaled down version of one of the power switches 120-1 to 120-n. The replica switch 220 may be coupled between the power grid discussed above and the reference current source 230. The replica switch 220 may be coupled to a different node on the power grid than the power switches 120-1 to 120-n.

In the example shown in FIG. 2, the replica switch 220 is implemented with a PFET 225 in which the source of the PFET 225 is coupled to the power grid. In some implementations, the gate of the PFET 225 may be coupled to the switch control circuit 125 (shown in FIG. 1) so that the replica switch 220 is turned on when the power switches 120-1 to 120-n are turned on. In other implementations, the gate of the PFET 225 may be controlled by the current processing circuit 160 or another circuit. It is to be appreciated that the replica switch 220 is not limited to the PFET 225, and may be implemented with another type of transistor in other implementations.

The reference current source 230 may be coupled between the replica switch 220 and ground. For the example where the replica switch 220 is implemented with the PFET 225, the reference current source 230 may be coupled between the drain of the PFET 225 and the ground. In certain aspects, the reference current source 230 is configured to provide a reference current (labeled "$I_{REF}$") that is approximately constant over PVT variation. For example, the reference current may be insensitive to variation in the supply voltage over a wide voltage range and/or variation in temperature over a wide temperature range. The reference current source 230 may be implemented using any one of a variety of techniques known in the art for generating a reference current that is insensitive to PVT. For example, the reference current source 230 may be implemented using accurate current mirroring techniques from a PVT-compensated bandgap reference in a different supply domain. The reference current may be orders of magnitude lower than the current supplied to the core 130.

The reference current flows through the replica switch 220 since the reference current source 230 is coupled in series with the replica switch 220. Because the reference current is approximately constant, changes in the IR voltage drop (labeled "$\Delta V_{REP}$") across the replica switch 220 are due to primarily to changes in the resistance (i.e., impedance) of the replica switch 220 due to PVT, and not due to changes in the reference current. Thus, assuming changes in the resistance of the replica switch 220 track changes in the resistance of the power switches 120-1 to 120-n across PVT, the voltage $\Delta V_{REP}$ across the replica switch 220 may be used to estimate the change in the resistance of the power switches 120-1 to 120-n due to PVT variation, as discussed further below.

The multiplexer 240 has a first input 242, a second input 244, a third input 246, a fourth input 248, a first output 252, and a second output 254. The power switches 120-1 to 120-n are coupled between the first input 242 and the second input 244 of the multiplexer 240. For the example where the power switches 120-1 to 120-n are implemented with the PFETs 122-1 to 122-n, the first input 242 is coupled to the sources of the PFETs 122-1 to 122-n, and the second input 244 is coupled to the drains of the PFETs 122-1 to 122-n. The replica switch 220 is coupled between the third input 246 and the fourth input 248 of the multiplexer 240. For the example where the replica switch 220 is implemented with the PFET 225, the third input 246 is coupled to the source of the PFET 225, and the fourth input 248 is coupled to the drain of the PFET 225. The first output 252 of the multiplexer 240 is coupled to the first input 262 of the amplifying circuit 260, and the second output 254 of the multiplexer 240 is coupled to the second input 264 of the amplifying circuit 260.

The multiplexer 240 is configured to selectively couple the power switches 120-1 to 120-n between the inputs 262 and 264 of the amplifying circuit 260 or couple the replica switch 220 between the inputs 262 and 264 of the amplifying circuit 260. For example, the multiplexer 240 may be configured to couple the power switches 120-1 to 120-n between the inputs 262 and 264 of the amplifying circuit 260 by coupling the first input 242 to the first output 252 and coupling the second input 244 to the second output 254. The multiplexer 240 may be configured to couple the replica switch 220 between the inputs 262 and 264 of the amplifying circuit 260 by coupling the third input 246 to the first output 252 and coupling the fourth input 248 to the second output 254. The selection of the multiplexer 240 may be controlled by a select signal (labeled "Sel") received at a select input 256 of the multiplexer 240.

In certain aspects, the system 205 includes a control circuit 290 configured to control the selection of the multiplexer 240 using the select signal. In some implementations, the control circuit 290 causes the multiplexer 240 to couple the power switches 120-1 and 120-n and the replica switch 220 to the inputs 262 and 264 of the amplifying circuit 260 in a time-interleaved fashion. For example, the control circuit 290 may cause the multiplexer 240 to alternate between coupling the power switches 120-1 to 120-n to the inputs 262 and 264 of the amplifying circuit 260 and coupling the replica switch 220 to the inputs 262 and 264 of the amplifying circuit 140. However, it is to be appreciated that the present disclosure is not limited to this example. In certain aspects, the control circuit 290 may communicate the multiplexer selection to the current processing circuit 280.

When the multiplexer 240 couples the power switches 120-1 to 120-n to the inputs 262 and 264 of the amplifying circuit 260, the amplifying circuit 260 senses the voltage $\Delta V_{SENSE}$ across the power switches 120-1 and 120-n. The amplifying circuit 260 amplifies the sensed voltage, and outputs the amplified sensed voltage to the ADC 270 via the output 266. The ADC 270 converts the amplified sensed voltage into a first digital signal indicating the sensed voltage across the power switches 120-1 to 120-n. The ADC 270 outputs the first digital signal to the current processing circuit 280. The current processing circuit 280 may use the first digital signal to estimate the current flow to the core 130 based on Ohm's law, as discussed above. In this example, the control circuit 290 may communicate to the current processing circuit 280 that the voltage $\Delta V_{SENSE}$ across the power switches 120-1 and 120-n is selected.

When the multiplexer 240 couples the replica switch 220 to the inputs 262 and 264 of the amplifying circuit 260, the amplifying circuit 260 senses the voltage $\Delta V_{REP}$ across the replica switch 220. The amplifying circuit 260 amplifies the sensed voltage across the replica switch 220, and outputs the amplified sensed voltage to the ADC 270 via the output 266. The ADC 270 converts the amplified sensed voltage into a second digital signal indicating the voltage across the replica switch 220. In this example, the control circuit 290 may communicate to the current processing circuit 280 that the voltage $\Delta V_{REP}$ across the replica switch 220 is selected.

Since the reference current $I_{REF}$ flowing through the replica switch 220 is approximately constant, a change in the voltage across the replica switch 220 is due to a change in the resistance (i.e., impedance) of the replica switch 220 due to PVT variation (e.g., supply voltage variation). In certain aspects, the current processing circuit 280 is configured to generate a compensation factor (i.e., compensation gain) based on the voltage across the replica switch 220 indicated by the second digital signal. The compensation factor corrects for a change in the resistance of the power switches 120-1 to 120-n due to PVT variation assuming the change in the resistance of the replica switch 220 tracks the change in the resistance of the power switches 120-1 to 120-n. After generating the compensation factor, the current processing circuit 280 applies the compensation factor to the estimated current flow to the core 130. Applying the compensation factor to the estimated current compensates the estimated current for the change in the resistance of the power switches 120-1 to 120-n due to PVT variation, resulting in a more accurate current estimate. For example, if a change in resistance causes the voltage across the replica switch 220 to increase, then the compensation factor may decrease the estimated current by a proportional amount to compensate for the change in resistance.

In one example, the compensation factor may be based on the following:

$$\text{Comp}=\Delta V_{REP\_REF}/\Delta V_{REP} \qquad (1)$$

where Comp is the compensation factor, $\Delta V_{REP\_REF}$ is the voltage across the replica switch 220 at a reference temperature and/or a reference supply voltage, and $\Delta V_{REP}$ is the most recent voltage across the replica switch 220 sensed by the amplifying circuit 260. In this example, the compensation factor provides compensation for changes in the resistance of the power switches 120-1 to 120-n with respect to the resistance of the power switches 120-1 to 120-n at the reference temperature and/or reference supply voltage. This assumes that changes in the resistance of the replica switch 220 track changes in the resistance of the power switches 120-1 to 120-n.

In certain aspects, the current-sensing circuit 210 obtains $\Delta V_{REP\_REF}$ by sensing the voltage across the replica switch 220 at the reference temperature and/or the reference supply voltage. In this example, the amplifying circuit 260 amplifies the sensed voltage across the replica switch 220 at the reference temperature and/or the reference supply voltage, and the ADC 270 converts the amplified sensed voltage into a digital signal, which provides a digital representation of $\Delta V_{REP\_REF}$. The current processing circuit 280 may store the digital representation of $\Delta V_{REP\_REF}$ in memory for later use to compute the compensation factor.

Figure 3:
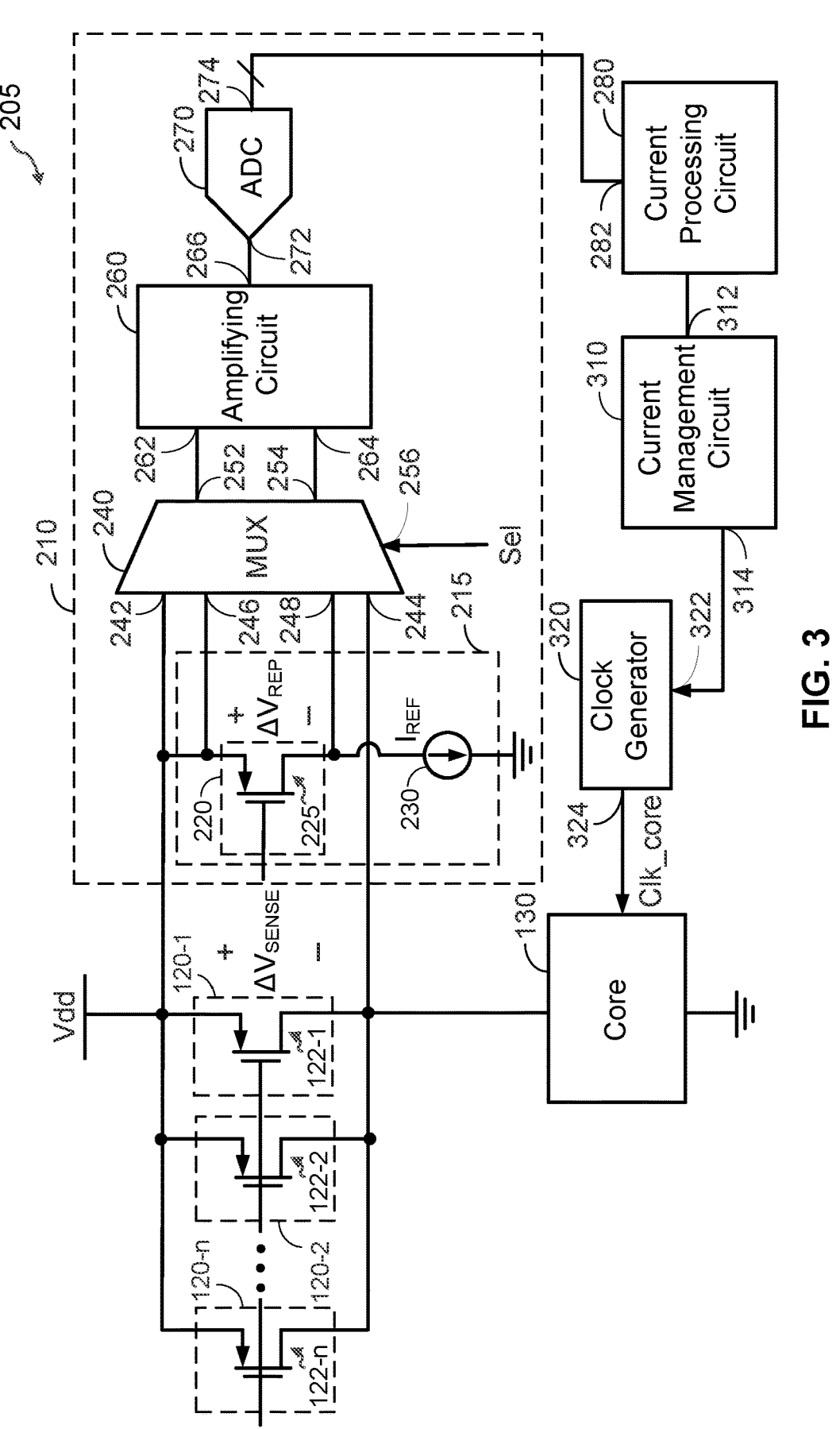
FIG. 3 shows an example of a system including a clock generator configured to generate a clock signal for a processing core according to certain aspects.

After correcting the estimated current using the compensation factor, the current processing circuit 280 may output the estimated current to a current management circuit, which uses the estimated current to manage the current flow to the core 130. For example, the current management circuit may manage the current to the core 130 by controlling the clock frequency of the core 130. In this regard, FIG. 3 shows an example in which the system 205 includes a current management circuit 310 and a clock generator 320 configured to generate a clock signal (labeled "Clk_core") to time operations in the core 130. The clock generator 320 (also referred to as a clock source) may be implemented with a phase locked loop (PLL), one or more frequency dividers, or any combination thereof. The current management circuit 310 has an input 312 coupled to the current processing circuit 280 to receive the estimated current, and an output 314. The clock generator 320 has an input 322 coupled to the output 314 of the current management circuit 310, and an output 324 coupled to the core 130. In this example, the clock generator 320 is configured to adjust the frequency of the clock signal based on a control signal received from the current management circuit 310 via the input 322, and output the clock signal to the core 130 via the output 324. It is to be appreciated that the control circuit 290 is not explicitly shown in FIG. 3 for case of illustration.

In this example, the current management circuit 310 may compare the estimated current to a current limit for the core 130. If the estimated current approaches or exceeds the current limit, then the current management circuit 310 may instruct the clock generator 320 to reduce the frequency of the clock signal to reduce the current drawn by the core 130.

It is to be appreciated that the current management circuit 310 is not limited to the example illustrated in FIG. 3, and the that the current management circuit 310 may manage current to the core 130 based on the estimated current using other techniques.

It is to be appreciated that the current-sensing circuit 210 is not limited to estimating current for a single core. For example, the current-sensing circuit 210 may estimate current for the core 130 and a second core (not shown). In this example, the multiplexer 240 may be implemented with a 3:1 multiplexer having inputs coupled to the power switches 120-1 to 120-n for the core 130, inputs coupled to the power switches (not shown) for the second core, and inputs coupled to the replica switch 220 to implement dual-core current sensing with replica compensation. In this example, the multiplexer 240 selects the power switches 120-1 to 120-n for the core 130 to estimate the current to the core 130, and selects the power switches for the second core to estimate the current to the second core. In this example, the current processing circuit 280 may apply the compensation factor determined based on the voltage across the replica switch 220 to the current estimate for each core. In this example, the control circuit 290 may cause the multiplexer 240 to select the power switches 120-1 to 120-n for the core 130, the power switches for the second core, and the replica switch 220 in a time-interleaved fashion. Thus, it is to be appreciated that the multiplexer 240 is not limited to a single core or a 2:1 multiplexer implementation. Accordingly, it is to be appreciated that the multiplexer 240 may include additional inputs in addition to the inputs 242, 244, 246, and 248 shown in the examples in FIGS. 2 and 3 to select power switches for one or more additional cores.

Figure 4:
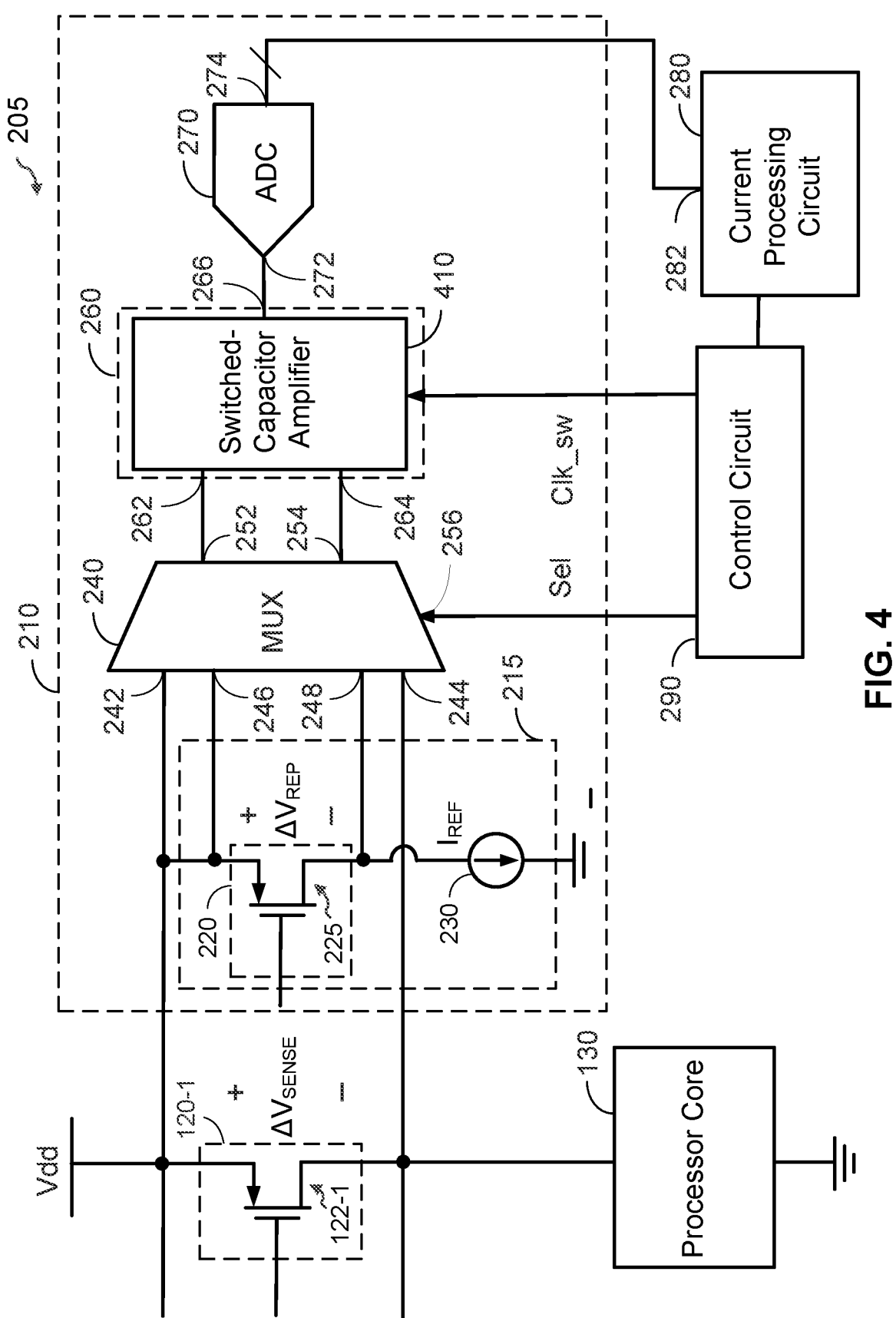
FIG. 4 shows an example of a current-sensing circuit including a switched-capacitor amplifier according to certain aspects of the present disclosure.

FIG. 4 shows an example in which the amplifying circuit 260 is implemented with a switched-capacitor amplifier 410 according to certain aspects. Note that some of the power switches 120-2 to 120-n are not explicitly shown in FIG. 4 for ease of illustration.

In this example, the timing of switching operations in the switched-capacitor amplifier 410 is controlled based on a clock signal (labeled "Clk_sw), which may be output from the control circuit 290. During each cycle (i.e., period) of the clock signal, the switched-capacitor amplifier 410 samples the voltage across the power switches 120-1 to 120-n or the voltage across the replica switch 220 during a sampling phase of the cycle, and amplifies the sampled voltage during an amplifying phase of the cycle. The ADC 270 then converts the amplified sampled voltage from the switched-capacitor amplifier 410 into a respective digital signal, which is output to the current processing circuit 280. Thus, in this example, the current-sensing circuit 210 outputs a digital signal (i.e., digital code) during each clock cycle (i.e., period of the clock signal) indicating the voltage across the power switches 120-1 to 120-n or the voltage across the replica switch 220 depending on which voltage is selected by the multiplexer 240.

Figures 5A, 5B:
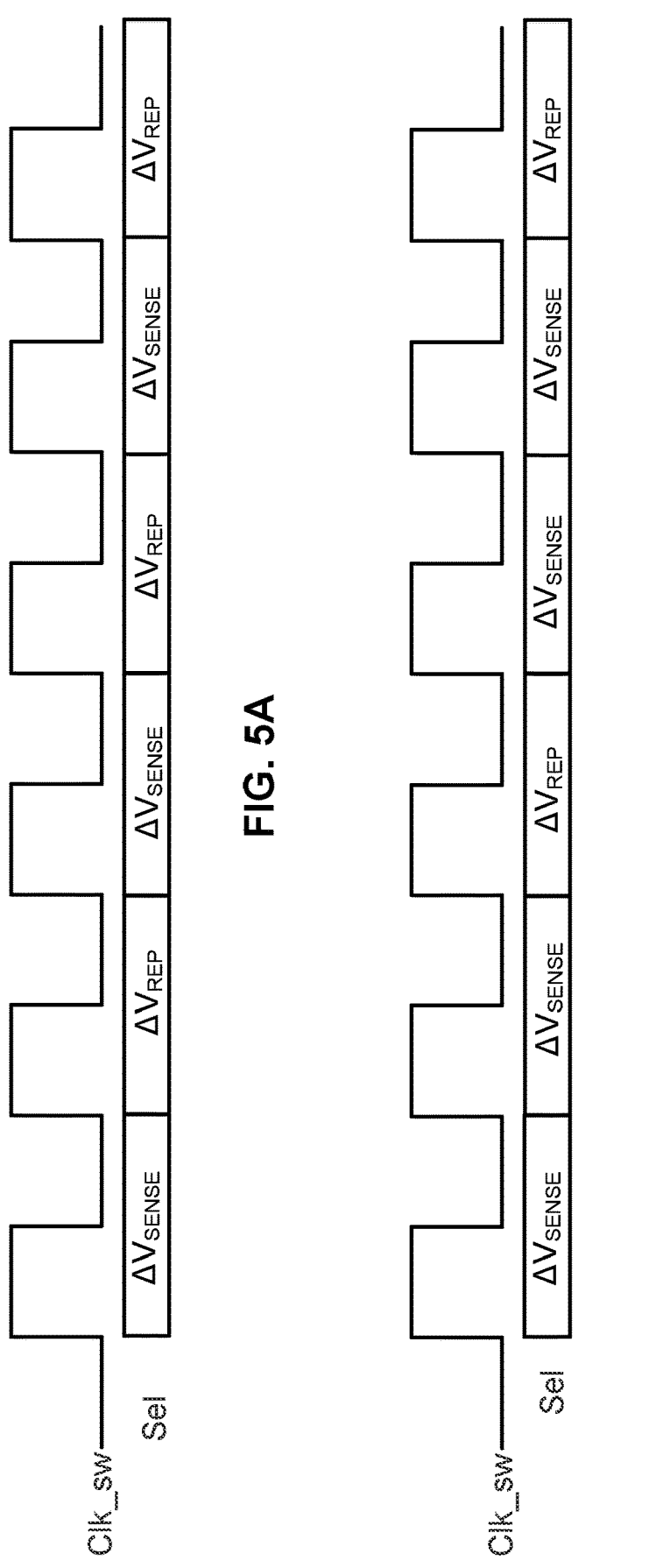
FIG. 5A is a timing diagram showing an example of cycles of a clock signal and a multiplexer selection for each of the cycles according to certain aspects of the present disclosure.
FIG. 5B is a timing diagram showing another example of cycles of a clock signal and a multiplexer selection for each of the cycles according to certain aspects of the present disclosure.

In this example, the control circuit 290 may coordinate the selection of the multiplexer 240 with the timing of the switched-capacitor amplifier 410. For example, the control circuit 290 may cause the multiplexer 240 to select the voltage $\Delta V_{SENSE}$ across the power switches 120-1 to 120-n during odd cycles of the clock signal Clk_sw, and select the voltage $\Delta V_{REP}$ across the replica switch 220 during even cycles of the clock signal Clk_sw, or vice versa. In this regard, FIG. 5A shows an exemplary timing diagram of the clock signal Clk_sw in which the multiplexer 240 alternates between selecting the voltage across the power switches 120-1 to 120-n and selecting the voltage $\Delta V_{REP}$ across the replica switch 220.

However, it is to be appreciated that the present disclosure is not limited to the above example. For example, for cases where the switch resistance (impedance) varies slowly relative to the frequency of the clock signal Clk_sw, the compensation factor may be updated less frequently. In these cases, the control circuit 290 may cause the multiplexer 240 to select the voltage $\Delta V_{SENSE}$ across the power switches 120-1 to 120-n during multiple clock cycles for each clock cycle the control circuit 290 causes the multiplexer 240 to select the voltage $\Delta V_{REP}$ across the replica switch 220. For example, FIG. 5B shows an exemplary timing diagram of the clock signal Clk_sw in which the multiplexer 240 selects the voltage across the power switches 120-1 to 120-n during two clock cycles for each clock cycle the multiplexer 240 selects the voltage $\Delta V_{REP}$ across the replica switch 220. However, it is to be appreciated that the present disclosure is not limited to this example.

A challenge with using the amplifying circuit 260 to amplify the voltage across the power switches 120-1 to 120-n and the voltage across the replica switch 220, is that the amplifying circuit 260 may have an input offset voltage (e.g., due to mismatches between transistors in the amplifying circuit 260). The offset voltage introduces an error at the output of the amplifying circuit 260, which reduces the accuracy of current sensing.

To address this, aspects of the present disclosure provide the switched-capacitor amplifier 410 with autozeroing for cancelling the offset voltage. The autozeroing eliminates or significantly reduces errors caused by the offset voltage, thereby improving the accuracy of the current sensing, as discussed further below.

Figure 6:
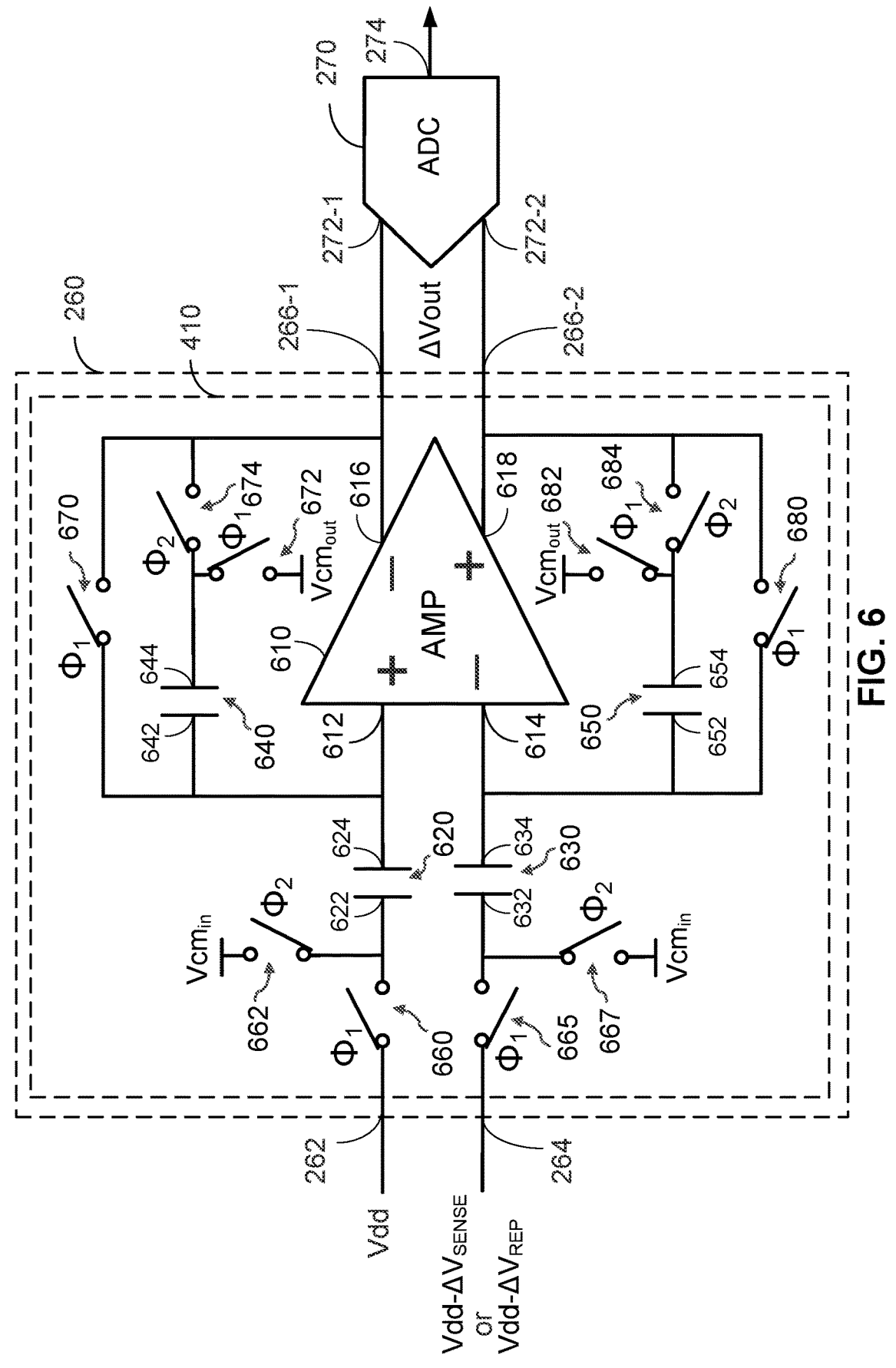
FIG. 6 shows an exemplary implementation of a switched-capacitor amplifier according to certain aspects of the present disclosure.

FIG. 6 shows an exemplary implementation of the switched-capacitor amplifier 410 with autozeroing according to certain aspects. In this example, the switched-capacitor amplifier 410 includes a first input capacitor 620, a second input capacitor 630, a first feedback capacitor 640, a second feedback capacitor 650, and an operational amplifier 610. The switched-capacitor amplifier 410 also includes a first switch 660, a second switch 662, a third switch 665, a fourth switch 667, a fifth switch 670, a sixth switch 672, a seventh switch 674, an eighth switch 680, a ninth switch 682, and a tenth switch 684. Each of the switches may be implemented with a respective transistor, a transmission gate, or another type of switch.

In this example, the operational amplifier 610 has a first input 612, a second input 614, a first output 616, and a second output 618. Also, in this example, the output 266 of the amplifying circuit 260 includes a first output 266-1 coupled to the first output 616 of the operational amplifier 610, and a second output 266-2 coupled to the second output 618 of the operational amplifier 610. Also, in this example, the input 272 of the ADC 270 includes a first input 272-1 coupled to the first output 266-1 of the amplifying circuit 260, and a second input 272-2 coupled to the second output 266-2 of the amplifying circuit 260. In this example, the ADC 270 may be implemented with a differential SAR ADC or another type of differential ADC.

For the case where the multiplexer 240 selects the voltage $\Delta V_{SENSE}$ across the power switches 120-1 to 120-n, the voltage at the first input 262 is approximately equal to the Vdd and the voltage at the second input 264 is approximately equal to Vdd–$\Delta V_{SENSE}$. In this case, the differential input voltage at the inputs 262 and 264 of the amplifying circuit 260 is $\Delta V_{SENSE}$. For the case where the multiplexer 240 selects the voltage $\Delta V_{REP}$ across the replica switch 220, the voltage at the first input 262 is approximately equal to the Vdd and the voltage at the second input 264 is approximately equal to Vdd–$\Delta V_{REP}$. In this case, the differential input voltage at the inputs 262 and 264 of the amplifying circuit 260 is $\Delta V_{REP}$. As used herein, the "differential input voltage" is the potential (i.e., voltage) difference between the first input 262 and the second input 264. As discussed further below, the switched-capacitor amplifier 410 is configured to amplify the differential input voltage (e.g., $\Delta V_{SENSE}$ Or $\Delta V_{REP}$) into a differential output voltage (labeled "$\Delta$Vout") at the outputs 266-1 and 266-2. As used herein, the "differential output voltage" is the potential (i.e., voltage) difference between the first output 266-1 and the second output 266-2.

In this example, the first switch 660 is coupled between the first input 262 and a first terminal 622 of the first input capacitor 620, and the second switch 662 is coupled between the first terminal 622 of the first input capacitor 620 and a common-mode input voltage (labeled "Vcm$_{in}$") of the operational amplifier 610. The common-mode input voltage may be set to the supply voltage Vdd or another potential. A second terminal 624 of the first input capacitor 620 is coupled to the first input 612 of the operational amplifier 610.

The third switch 665 is coupled between the second input 264 and a first terminal 632 of the second input capacitor 630, and the fourth switch 667 is coupled between the first terminal 632 of the second input capacitor 630 and the common-mode input voltage Vcm$_{in}$ of the operational amplifier 610. A second terminal 634 of the second input capacitor 630 is coupled to the second input 614 of the operational amplifier 610.

The fifth switch 670 is coupled between the first input 612 and the first output 616 of the operational amplifier 610. A first terminal 642 of the first feedback capacitor 640 is coupled to the first input 612 of the operational amplifier 610. The sixth switch 672 is coupled between a second terminal 644 of the first feedback capacitor 640 and a common-mode output voltage (labeled "Vcm$_{out}$") of the operational amplifier 610, which may match a common-mode input voltage of the ADC 270. The seventh switch 674 is coupled between the second terminal 644 of the first feedback capacitor 640 and the first output 616 of the operational amplifier 610.

The eighth switch 680 is coupled between the second input 614 and the second output 618 of the operational amplifier 610. A first terminal 652 of the second feedback capacitor 650 is coupled to the second input 614 of the operational amplifier 610. The ninth switch 682 is coupled between a second terminal 654 of the second feedback capacitor 650 and the common-mode output voltage Vcm$_{out}$ of the operational amplifier 610. The tenth switch 684 is coupled between the second terminal 654 of the second feedback capacitor 650 and the second output 618 of the operational amplifier 610.

In this example, the on/off states of the switches 660, 665, 670, 672, 680, and 682 are controlled by a first control signal (labeled "$\Phi_1$"), and the on/off states of the switches 662, 667, 674, and 684 are controlled by a second control signal (labeled "$\Phi_2$"). The first control signal and the second control signal are periodic signals having the same frequency and are 180 degrees output of phase with one another. In certain aspects, each of the switches 660, 665, 670, 672, 680, and 682 may be configured to turn on when the first control signal is high and turn off when the first control signal is low, or vice versa. Each of the switches 662, 667, 674, and 684 may be configured to turn on when the second control signal is high and turn off when the second control signal is low, or vice versa.

The first control signal $\Phi_1$ and the second control signal $\Phi_2$ may be generated by the control circuit 290 (not shown in FIG. 6) based on the clock signal Clk_sw, as discussed further below. For the example where the switches in the switched-capacitor amplifier 410 turn on when the corresponding control signal is high, the high phases of the first control signal $\Phi_1$ and the high phases of the second control signal $\Phi_2$ may be non-overlapping to ensure that the switches 660, 665, 670, 672, 680, and 682 controlled by the first control signal $\Phi_1$ do not turn on at the same time as the switches 662, 667, 674, and 684 controlled by the second control signal $\Phi_2$. This may be achieved, for example, by inserting a small delay between a falling edge of the second clock signal and a rising edge of first clock signal, and vice versa.

Figure 7:
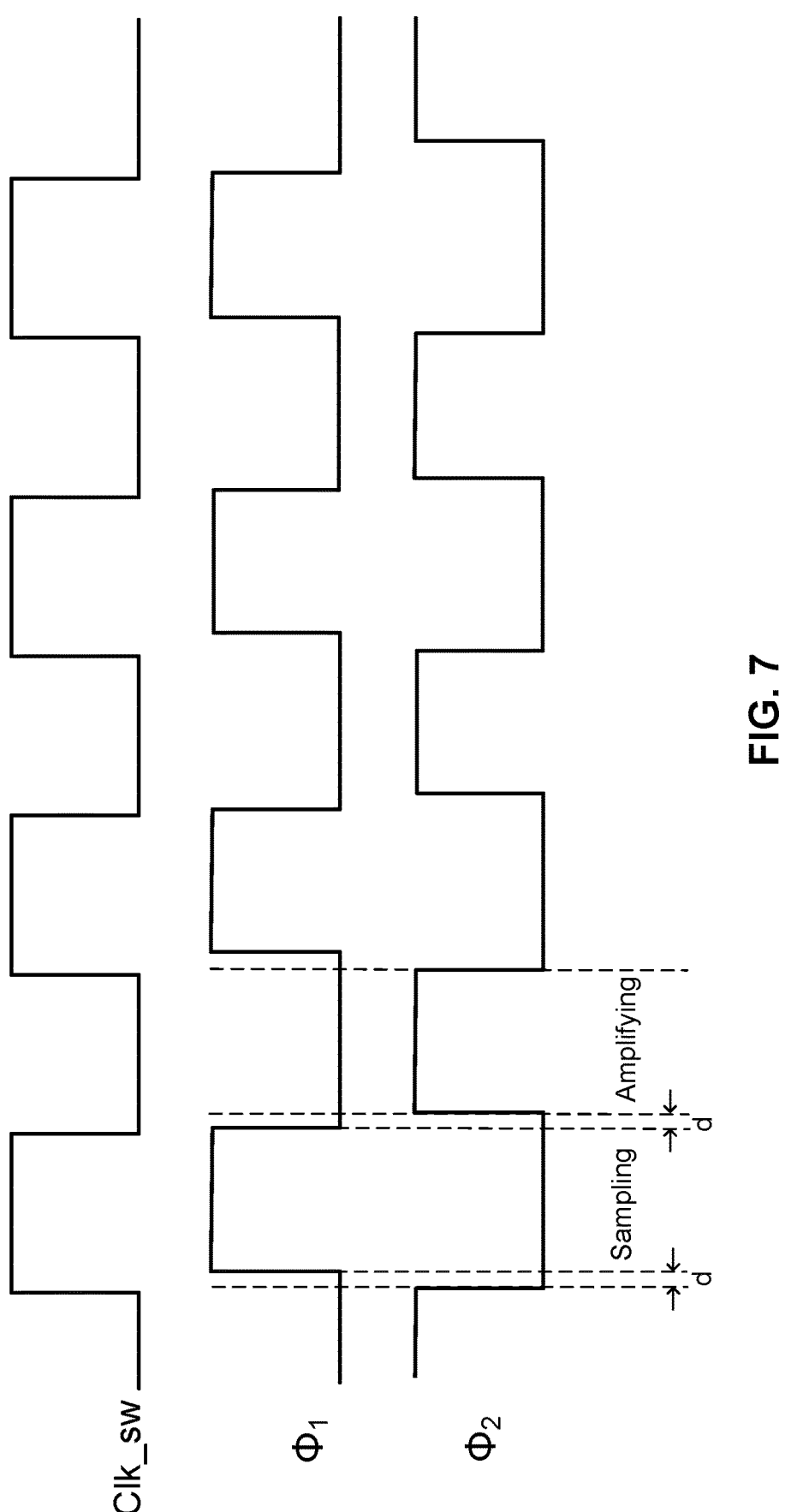
FIG. 7 is a timing diagram showing an example of signals for controlling switches in the switched-capacitor amplifier according to certain aspects of the present disclosure.

FIG. 7 is a timing diagram showing an example of the first control signal $\Phi_1$ and the second control signal $\Phi_2$. As shown in FIG. 7, the first control signal $\Phi_1$ and the second control signal $\Phi_2$ are approximately 180 degrees out of phase. Also, the high phases of the first control signal $\Phi_1$ and the high phases of the second control signal $\Phi_2$ are non-overlapping, in which the high phases of the first control signal $\Phi_1$ and the high phases of the second control signal $\Phi_2$ are spaced apart by dead bands (labeled "d") to ensure that the switches 660, 665, 670, 672, 680, and 682 controlled by the first control signal $\Phi_1$ do not turn on at the same time as the switches 662, 667, 674, and 684 controlled by the second control signal $\Phi_1$. The dead bands may also be referred to as dead time or another time. In this example, the first control signal $\Phi_1$ and the second control signal $\Phi_2$ are generated based on the clock signal Clk_sw. In the example in FIG. 7, each of the first control signal $\Phi_1$ and the second control signal $\Phi_2$ has a cycle (i.e., a period) approximately equal to one cycle (i.e., period) of the clock signal Clk_sw. In certain aspects, the first control signal $\Phi_1$ turns on after the second control signal $\Phi_2$ is fully turned off, and the second control signal $\Phi_2$ turns on after the first control signal $\Phi_1$ is fully turned off.

Exemplary operation of the switched-capacitor amplifier 410 will now be described according to certain aspects. During each cycle (i.e., period) of the clock signal Clk_sw, the switched-capacitor amplifier 410 samples the voltage across the power switches 120-1 to 120-$n$ or the voltage across the replica switch 220 during a sampling phase of the cycle, and amplifies the sampled voltage during an amplifying phase of the cycle. The sampling phase may also be referred to as the acquisition phase, input phase or another term, and the amplifying phase may also be referred to as the charge transfer phase, or another term. The sampling phase and the amplifying phase are discussed further below according to certain aspects. In the example shown in FIG. 7, the sampling phase corresponds to the high phase of the first clock signal $\Phi_1$ and the amplifying phase corresponds to the high phase of the second clock signal $\Phi_2$. However, it is to be appreciated that the present disclosure is not limited to this example.

Figure 8A:
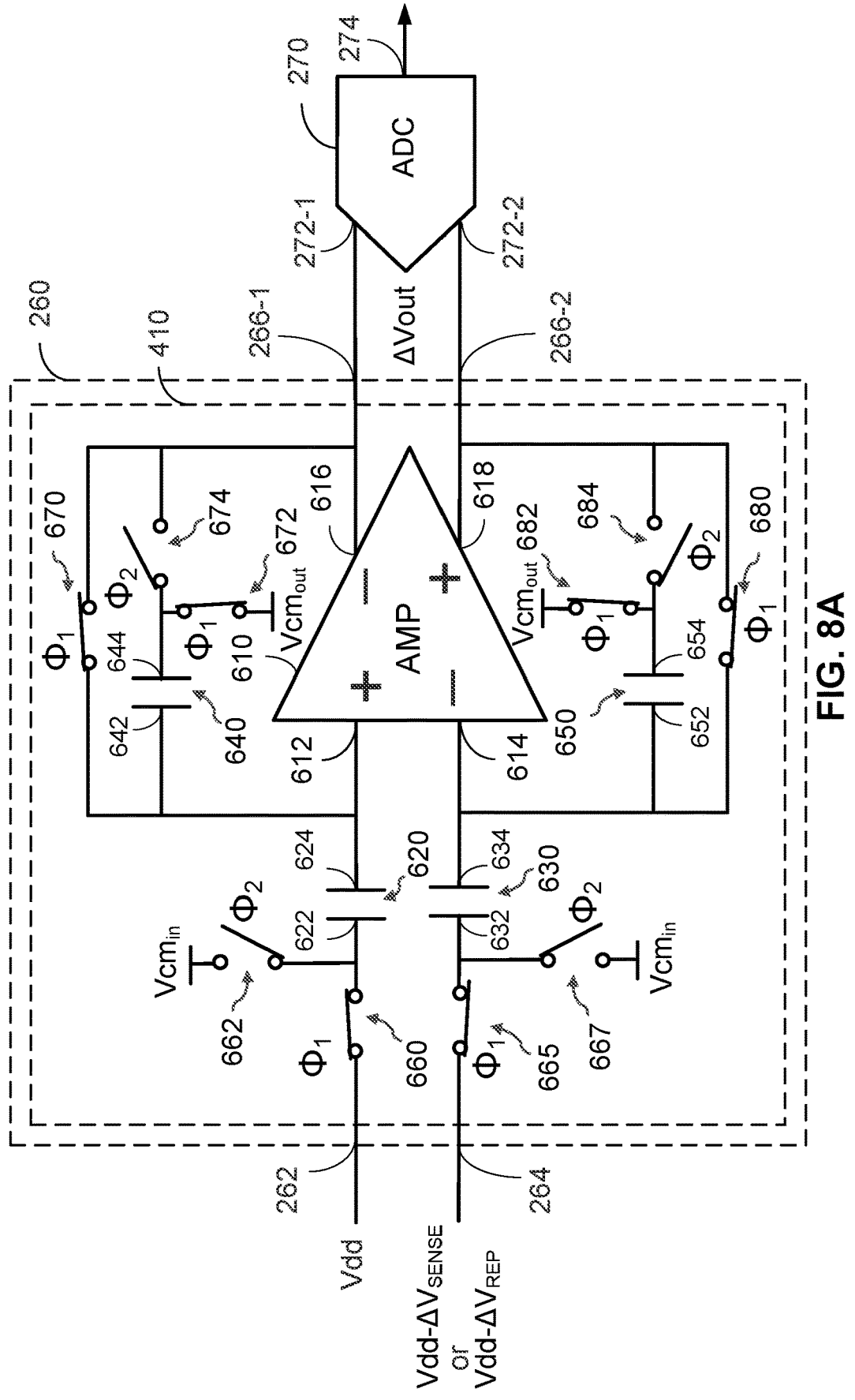
FIG. 8A shows an example of switches in the switched-capacitor amplifier during a sampling phase according to certain aspects of the present disclosure.

During the sampling phase, the switches 660, 665, 670, 672, 680, and 682 are turned on (i.e., closed) by the first control signal $\Phi_1$, and the switches 662, 667, 674, 684 are turned off (i.e., opened) by the second control signal $\Phi_2$. An example of the switches in the sampling phase is shown in FIG. 8A. As shown in FIG. 8A, during the sampling phase, the first input capacitor 620 is coupled between the first input 262 and the first input 612 of the operational amplifier 610, and the second input capacitor 630 is coupled between the second input 264 and the second input 614 of the operational amplifier 610. Also, the first feedback capacitor 640 is coupled between the first input 612 of the operational amplifier 610 and the common-mode output voltage Vcm$_{out}$, and the second feedback capacitor 650 is coupled between the second input 614 of the operational amplifier 610 and the common-mode output voltage Vcm$_{out}$. Also, the first output 616 of the operational amplifier 610 is coupled to the first input 612 of the operational amplifier 610, and the second output 618 of the operational amplifier 610 is coupled to the second input 614 of the operational amplifier 610.

During the sampling phase, the first input capacitor 620 is charged based on the voltage (e.g., vdd) at the first input 262 of the amplifying circuit 260 and the offset voltage, and the second input capacitor 630 is charged based on the voltage (e.g., Vdd$-\Delta V_{SENSE}$ or Vdd$-\Delta V_{REP}$) at the second input 626 of the amplifying circuit 260 and the offset voltage. Thus, the offset voltage affects the charge on the first input capacitor 620 and the charge on the second input capacitor 630 during the sampling phase, which could affect the differential output voltage of the switched-capacitor amplifier 410 during the amplifying phase without autozeroing.

During the sampling phase, the feedback capacitors 640 and 650 sample the offset voltage since the feedback capacitors 640 and 650 are coupled to the inputs 612 and 614 of the operational amplifier 610, respectively. As discussed further below, this cancels the effect of the charges on the input capacitors 620 and 630 due to the offset voltage during the sampling phase from the differential output voltage of the amplifying circuit 260 during the amplifying phase.

Figure 8B:
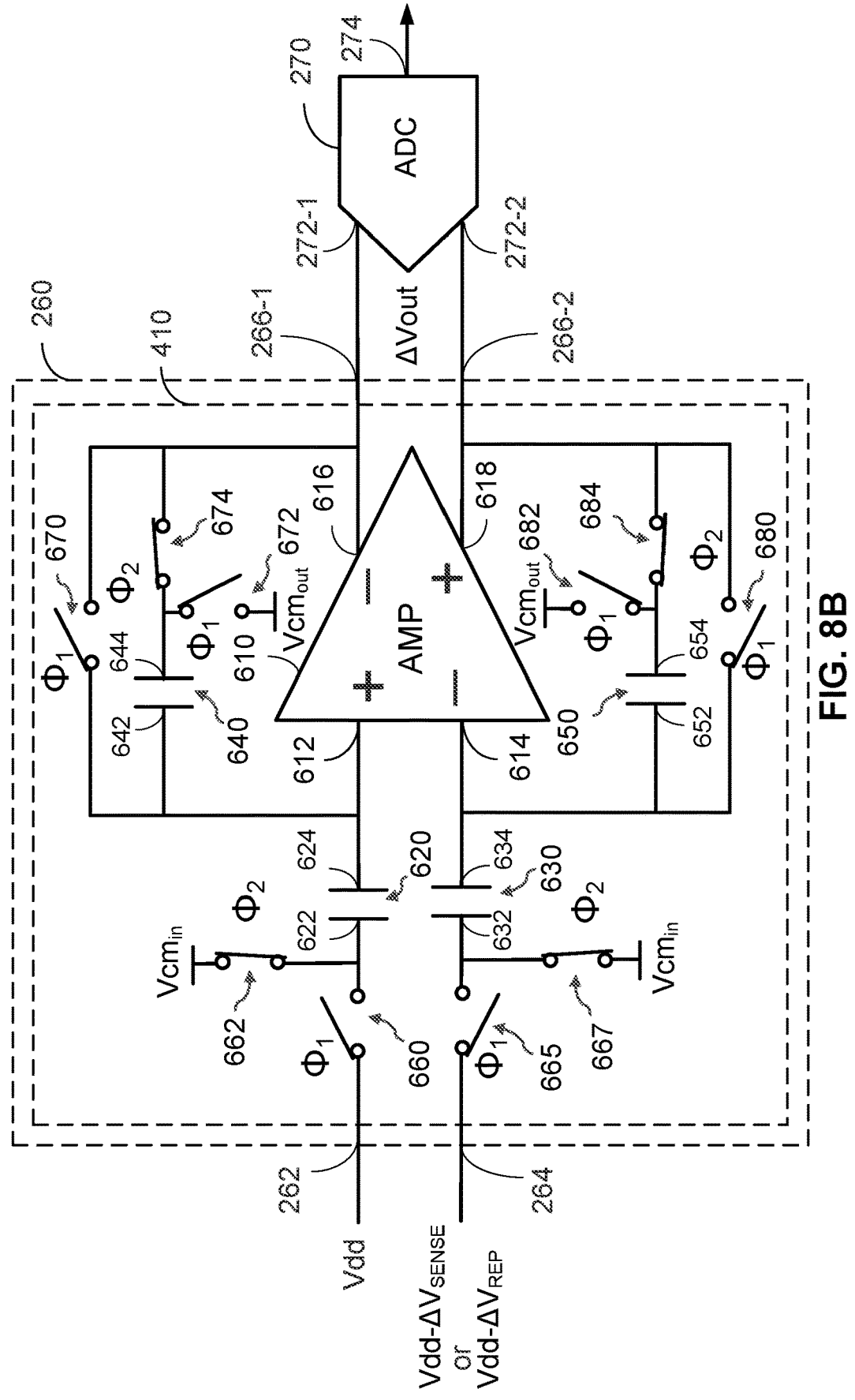
FIG. 8B shows an example of the switches in the switched-capacitor amplifier during an amplifying phase according to certain aspects of the present disclosure.

During the amplifying phase, the switches 660, 665, 670, 672, 680, and 682 are turned off (i.e., opened) by the first control signal $\Phi_1$, and the switches 662, 667, 674, 684 are turned on (i.e., closed) by the second control signal $\Phi_2$. An example of the switches in the amplifying phase is shown in FIG. 8B. As shown in FIG. 8B, during the amplifying phase, the first input capacitor 620 is coupled between the first input 262 and the common-mode input voltage $Vcm_{in}$, and the second input capacitor 630 is coupled between the second input 264 and the common-mode input voltage $Vcm_{in}$. Also, the first feedback capacitor 640 is coupled between the first input 612 of the operational amplifier 610 and the first output 616 of the operational amplifier 610, and the second feedback capacitor 650 is coupled between the second input 614 of the operational amplifier 610 and the second output 618 of the operational amplifier 610.

During the amplifying phase, charge on the first input capacitor 620 is transferred to the first feedback capacitor 640, and charge on the second input capacitor 630 is transferred to the second feedback capacitor 650. The charge transfer generates the differential output voltage $\Delta V_{OUT}$ of the switched-capacitor amplifier 410 which is related to the differential input voltage (e.g., $\Delta V_{SENSE}$ or $\Delta V_{REP}$) by a gain of $-Cin/Cfb$ where Cin is the capacitance of each of the input capacitors 620 and 630 and Cfb is the capacitance of each of the feedback capacitors 640 and 650.

As discussed above, the sampling of the offset voltage by the feedback capacitors 640 and 650 during the sampling phase cancels the effect of the charges on the input capacitors 620 and 630 due to the offset voltage during the sampling phase from the differential output voltage of the switched-capacitor amplifier 410 during the amplifying phase. As a result, the differential output voltage is equal to the differential input voltage multiplied by the gain (e.g., $-Cin/Cfb$) of the switched-capacitor amplifier 410 independent of the offset voltage. This improves the accuracy of the current sensing by removing the offset voltage as a source of error in the current sensing.

Thus, in this example, the autozeroing includes sampling the offset voltage of the operational amplifier 610 with the feedback capacitors 640 and 650 during the sampling phase, and using the sampled offset voltage to cancel the effect of the offset voltage on the output voltage of the switched-capacitor amplifier 410 during the amplifying phase. The output voltage may include the sampled amplified voltage $\Delta V_{SENSE}$ or the sampled amplified voltage $\Delta V_{REP}$ depending on depending on which one of voltages $\Delta V_{SENSE}$ and $\Delta V_{REP}$ is selected by the multiplexer 240.

The ADC 270 converts the differential output voltage of the switched-capacitor amplifier 410 into a digital signal that provides a digital representation of the differential output voltage. Since the differential output voltage is related to the differential input voltage (e.g., $\Delta V_{SENSE}$ Or $\Delta V_{REP}$) by the gain of the switched-capacitor amplifier 410, the digital signal indicates the voltage $\Delta V_{SENSE}$ across the power switches 120-1 to 120-$n$ or the voltage $\Delta V_{REP}$ across the replica switch 220 depending on which voltage is selected by the multiplexer 240. As discussed above, the current processing circuit 280 uses the digital representation of the voltage $\Delta V_{SENSE}$ across the power switches 120-1 to 120-$n$ to estimate the current flow to the core 130, and uses the digital representation of the voltage $\Delta V_{REP}$ across the replica switch 220 to generate the compensation factor to compensate the estimated current for variation in switch resistance due to PVT variation. As used herein, switch resistance refers to the resistance of one or more switches when the one or more switches are turned on (also referred to as on resistance).

Figure 9:
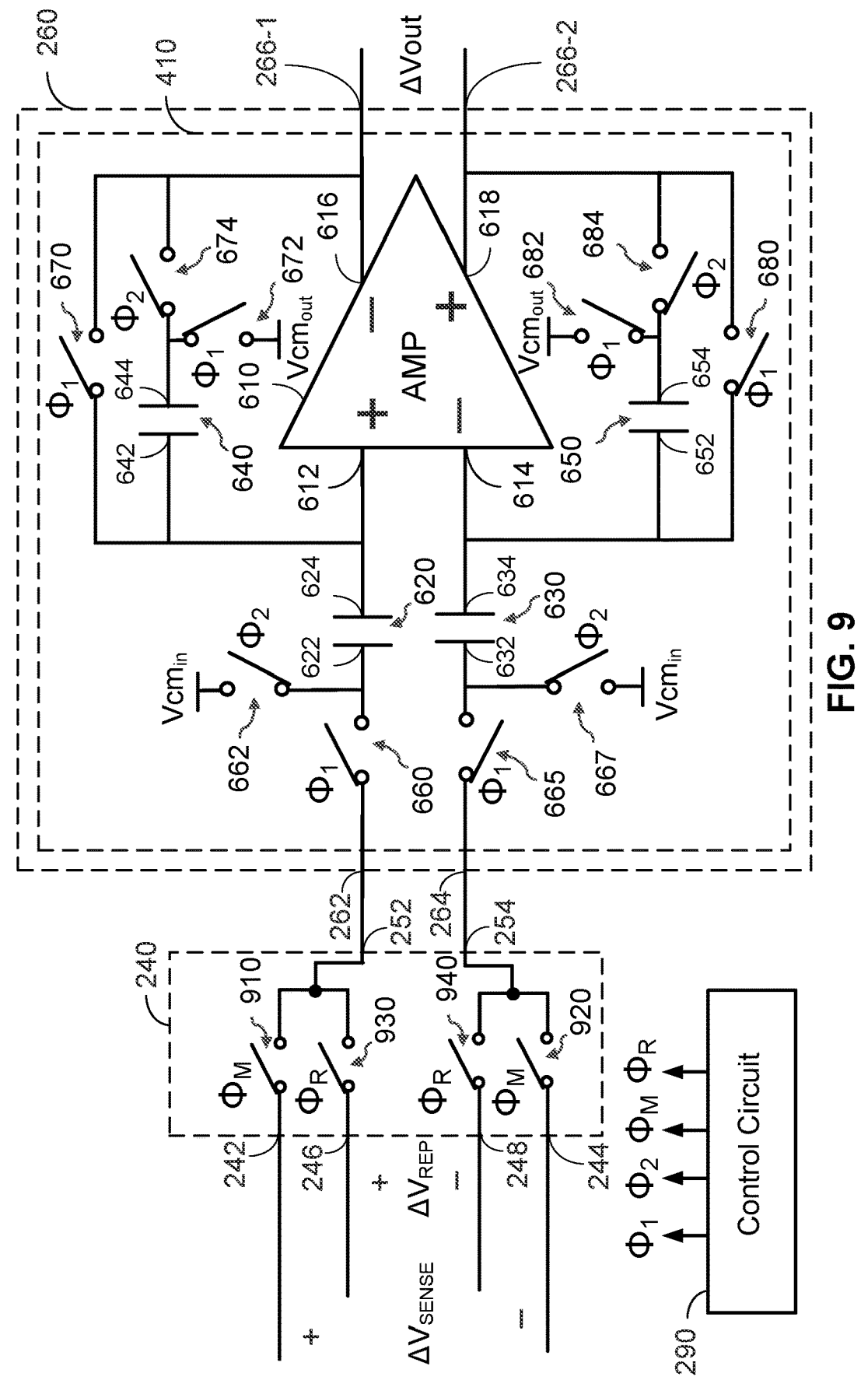
FIG. 9 shows an exemplary implementation of a multiplexer according to certain aspects of the present disclosure.

FIG. 9 shows an exemplary implementation of the multiplexer 240 according to certain aspects. In this example, the multiplexer 240 includes a first switch 910 coupled between the first input 242 and the first output 252, a second switch 920 coupled between the second input 244 and the second output 254, a third switch 930 coupled between the third input 246 and the first output 252, and a fourth switch 940 coupled between the fourth input 248 and the second output 254. Each of the switches 910, 920, 930, and 940 may be implemented with a respective transistor, transmission gate, or another type of switch.

The on/off states of the first switch 910 and the second switch 920 are controlled by a third control signal (labeled "$\Phi_M$"). For example, the first switch 910 and the second switch 920 may be configured to turn on when the third control signal is high and turn off when the third control signal is low, or vice versa. The on/off states of the third switch 930 and the fourth switch 940 are controlled by a fourth control signal (labeled "$\Phi_R$"). For example, the third switch 930 and the fourth switch 940 may be configured to turn on when the fourth control signal is high and turn off when the fourth control signal is low, or vice versa.

In this example, the select signal Sel of the multiplexer 240 includes the third control signal $\Phi_M$ and the fourth control signal $\Phi_R$. In the example in FIG. 9, the control circuit 290 generates the third control signal $\Phi_M$ and the fourth control signal $\Phi_R$ to control the selection of the multiplexer 240. For example, the control circuit 290 may cause the multiplexer 240 to select the voltage $\Delta V_{SENSE}$ across the power switches 120-1 to 120-$n$ by turning on the first switch 910 and the second switch 920 using the third control signal $\Phi_M$, and turning off the third switch 930 and the fourth switch 940 using the fourth control signal $\Phi_R$. In this case, the voltage $\Delta V_{SENSE}$ across the power switches 120-1 to 120-$n$ provides the differential input voltage for the amplifying circuit 260. Also, in this example, the control circuit 290 may cause the multiplexer 240 to select to select the voltage $\Delta V_{REP}$ across the replica switch 220 by turning off the first switch 910 and the second switch 920 using the third control signal $\Phi_M$, and turning on the third switch 930 and the fourth switch 940 using the fourth control signal $\Phi_R$. In this case, the voltage $\Delta V_{REP}$ across the replica switch 220 provides the differential input voltage for the amplifying circuit 260.

In certain aspects, the control circuit 290 coordinates the selection of the multiplexer 240 with the timing of the switched-capacitor amplifier 410 using the first control signal $\Phi_1$, the second control signal $\Phi_2$, the third control signal $\Phi_M$, and the fourth control signal $\Phi_R$.

Figure 10A:
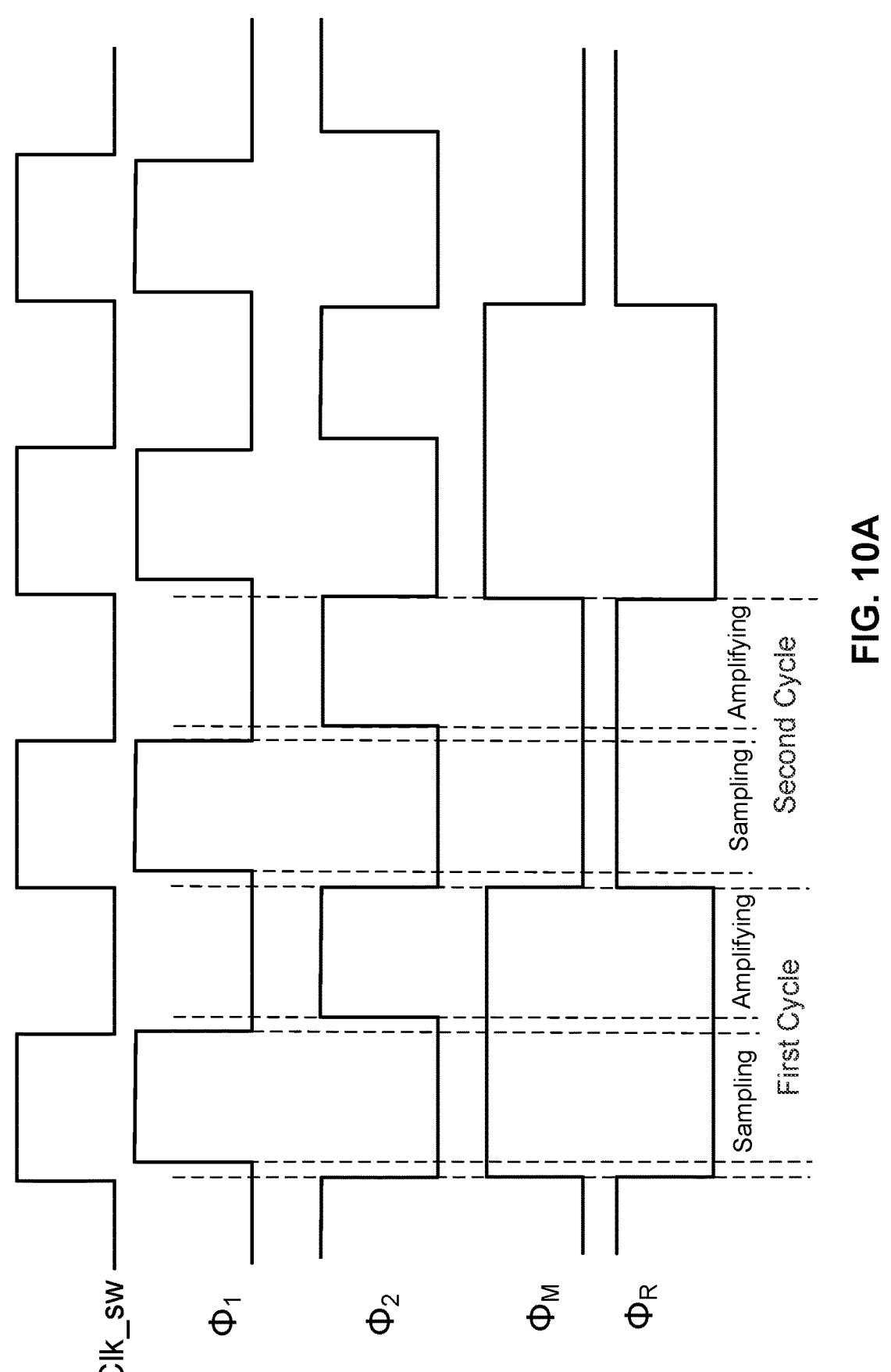
FIG. 10A is a timing diagram showing an example of signals for controlling switches in the multiplexer and switches in the switched-capacitor amplifier according to certain aspects of the present disclosure.

In this regard, FIG. 10A shows an exemplary timing diagram of the first control signal $\Phi_1$, the second control signal $\Phi_2$, the third control signal $\Phi_M$, and the fourth control signal $\Phi_R$ for an example in which the multiplexer 240 alternates between selecting the voltage $\Delta V_{SENSE}$ across the power switches 120-1 to 120-$n$ and selecting the voltage $\Delta V_{REP}$ across the replica switch 220. In the example shown in FIG. 10A, each of the switches in the multiplexer 240 and each of the switches in the switched-capacitor amplifier 410 turns on when the respective control signal is high and turns off when the respective control signal is low. However, it is to be appreciated that the present disclosure is not limited to this example. In the example shown in FIG. 10A, the high phases of the first control signal $\Phi_1$ and the high phases of the second control signal $\Phi_2$ are non-overlapping. It is to be appreciated that the high phases of the third control signal $\Phi_M$ and the high phases of the fourth control signal $\Phi_R$ may also be made non-overlapping.

In this example, during a first cycle of the clock signal Clk, the multiplexer 240 selects the voltage $\Delta V_{SENSE}$ across the power switches 120-1 to 120-$n$. During a sampling phase of the first cycle, the switched-capacitor amplifier 410 samples the voltage $\Delta V_{SENSE}$, and during an amplifying phase of the first cycle, the switched-capacitor amplifier 410 amplifies the sampled voltage $\Delta V_{SENSE}$. During a second cycle of the clock signal Clk, the multiplexer 240 selects the voltage $\Delta V_{REP}$ across the replica switch 220. During a sampling phase of the second cycle, the switched-capacitor amplifier 410 samples the voltage $\Delta V_{REP}$, and during an amplifying phase of the second cycle, the switched-capacitor amplifier 410 amplifies the sampled voltage $\Delta V_{REP}$.

In the example shown in FIG. 10A, each of the third control signal $\Phi_M$ and the fourth control signal $\Phi_R$ is a periodic signal having a frequency equal to half the frequency of each of the first control signal 1 and the second control signal $\Phi_2$. Also, the third control signal $\Phi_M$ and the fourth control signal $\Phi_R$ are 180 degrees out of phase to cause the multiplexer 240 to alternate between selecting the voltage $\Delta V_{SENSE}$ across the power switches 120-1 to 120-$n$ and selecting the voltage $\Delta V_{REP}$ and across the replica switch 220.

However, it is to be appreciated that the present disclosure is not limited to the above example. For example, for cases where the switch resistance (impedance) varies slowly relative to the frequency of the clock signal Clk_sw, the compensation factor may be updated less frequently. In these cases, the control circuit 290 may cause the multiplexer 240 to select the voltage $\Delta V_{SENSE}$ across the power switches 120-1 to 120-$n$ during multiple clock cycles for each clock cycle the control circuit 290 causes the multiplexer 240 to select the voltage $\Delta V_{REP}$ across the replica switch 220.

Figure 10B:
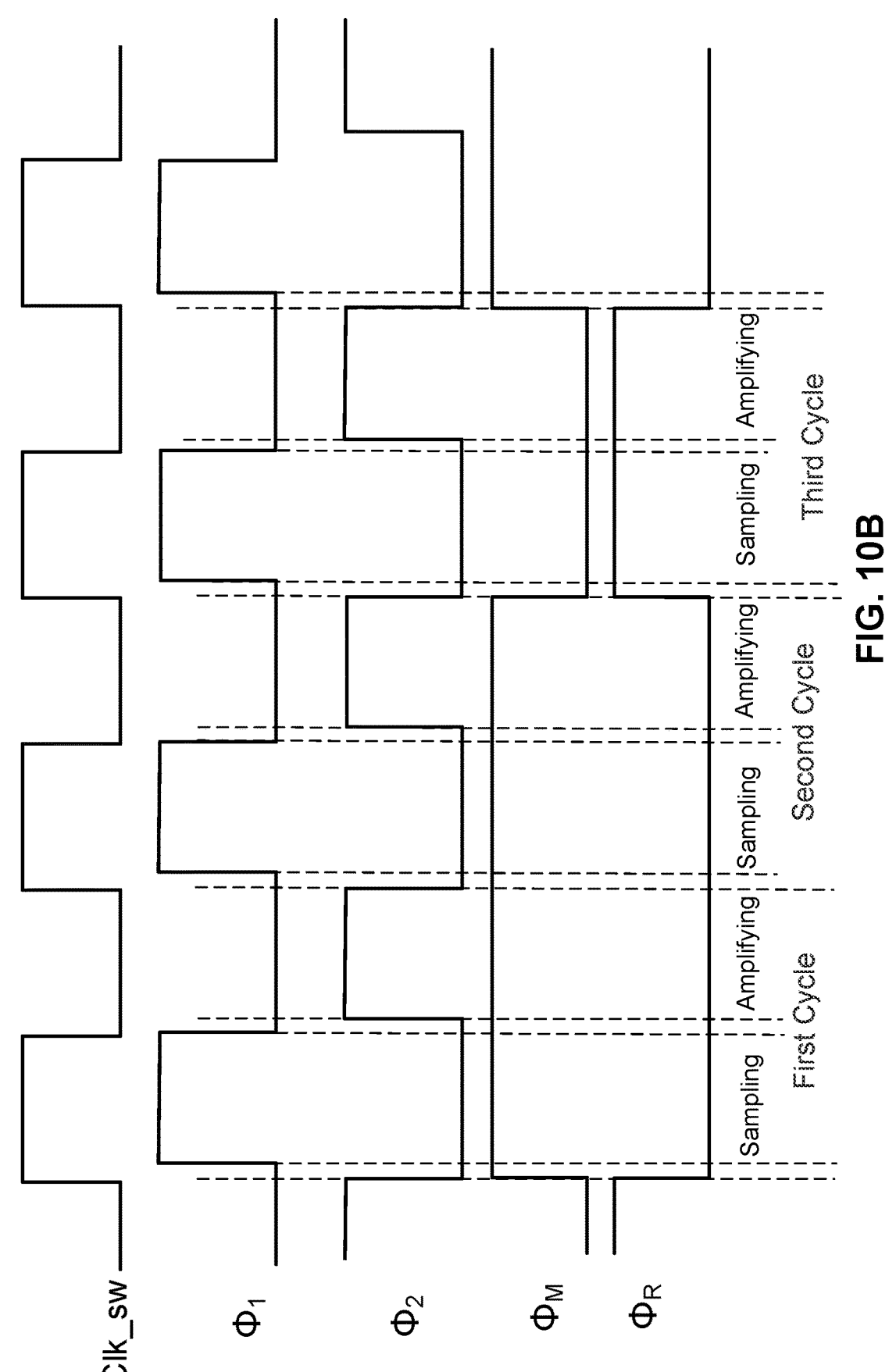
FIG. 10B is a timing diagram showing another example of signals for controlling the switches in the multiplexer and the switches in the switched-capacitor amplifier according to certain aspects of the present disclosure.

For example, FIG. 10B shows an exemplary timing diagram of the first control signal $\Phi_1$, the second control signal $\Phi_2$, the third control signal $\Phi_M$, and the fourth control signal $\Phi_R$ for an example in which the multiplexer 240 selects the voltage $\Delta V_{SENSE}$ across the power switches 120-1 to 120-$n$ during two clock cycles for each clock cycle the multiplexer 240 selects the voltage $\Delta V_{REP}$ across the replica switch 220. In the example shown in FIG. 10B, the multiplexer 240 selects the selects the voltage $\Delta V_{SENSE}$ across the power switches 120-1 to 120-$n$ during the first cycle and the second cycle of the clock signal, and selects the voltage $\Delta V_{REP}$ across the replica switch 220 during a third cycle of the clock signal.

In general, the control circuit 290 may be configured to cause the multiplexer 240 to select the voltage $\Delta V_{REP}$ across the replica switch 220 during k clock cycles for every N consecutive clock cycles, where k is equal to or greater than one, and k is less than N. In this example, the control circuit 290 causes the multiplexer 240 to select the voltage $\Delta V_{SENSE}$ across the power switches 120-1 to 120-$n$ during N–k clock cycles for every N consecutive clock cycles. In the example illustrated in FIG. 10B, k is one and N is three. However, it is to be appreciated that the present disclosure is not limited to this example.

In certain aspects, k and/or N may be programmable parameters. For example, k and/or N may be programmed by the current processing circuit 280 or another circuit based on how fast the resistance of the replica switch 220 changes over time. For example, the current processing circuit 280 may increase k when the resistance of the replica switch 220 changes at a faster rate, and decrease k when the resistance of the replica switch 220 changes at a slower rate.

FIG. 11 shows an example of a method 1100 for current sensing according to certain aspects of the present disclosure.

At block 1110, a voltage across one or more power switches is amplified using an amplifying circuit to obtain a first amplified voltage. For example, the voltage may correspond to the voltage $\Delta V_{SENSE}$ and the one or more power switches may correspond to one or more of the power switches 120-1 to 120-$n$. The amplifying circuit 260 may amplify the voltage across the one or more power switches. In certain aspects, the one or more power switches are coupled between a power grid and a processing core (e.g., core 130). In certain aspects, the amplifying circuit includes the switched-capacitor amplifier 410.

At block 1120, an estimated current is determined based on the first amplified voltage. For example, the current processing circuit 280 may determine the estimated current.

At block 1130, a voltage across a replica switch is amplified using the amplifying circuit to obtain a second amplified voltage, wherein the replica switch is coupled in series with a current source. For example, the voltage may correspond to the voltage $\Delta V_{REP}$, the replica switch may correspond to the replica switch 220, and the current source may correspond to the reference current source 230. The amplifying circuit 260 may amplify the voltage across the replica switch. In certain aspects, the replica switch is coupled between a power grid and the current source.

At block 1140, a compensation factor is generated based on the second amplified voltage, the compensation factor compensating for a change in a resistance of the one or more power switches. For example, the current processing circuit 280 may generate the compensation factor. The change in resistance may be due, for example, to a change in a supply voltage and/or a change in temperature.

At block 1150, the compensation factor is applied to the estimated current. For example, the current processing circuit 280 may apply the compensation factor to the estimated current.

It is to be appreciated that the blocks 1110, 1120, 1130, 1140, and 1150 are not limited to a particular order. For example, in some implementations, the block 1130 may precede the block 1110 (i.e., the voltage across the replica switch 220 may be amplified to obtain the second amplified voltage before the voltage across the one or more power switches is amplified to obtain the first amplified voltage). In other words, the blocks 1110, 1120, 1130, 1140, and 1150 may be performed in any suitable order.

In certain aspects, the method 1100 may further include coupling the voltage across the one or more power switches between a first input of the amplifying circuit and a second input of the amplifying circuit using a multiplexer during a first cycle of a clock signal, and coupling the voltage across the replica switch between the first input of the amplifying circuit and the second input of the amplifying circuit using the multiplexer during a second cycle of the clock signal. For example, the multiplexer may correspond to the multiplexer 240 and the clock signal may correspond to the clock signal Clk_sw.

In certain aspects, amplifying the voltage across the one or more power switches may include amplifying the voltage across the one or more power switches using the amplifying circuit during the first cycle of the clock signal, and amplifying the voltage across the replica switch may include amplifying the voltage across the replica switch using the amplifying circuit during the second cycle of the clock signal.

In certain aspects, generating the compensation factor includes generating the compensation factor based on a ratio of the second amplified voltage and a reference voltage, wherein the reference voltage corresponds to a voltage across the replica switch at a reference supply voltage, a reference temperature, or both. In this example, the reference voltage may correspond to $\Delta V_{REP\_REF}$ multiplied by the gain of the amplifying circuit (e.g., the amplifying circuit 260) and the second amplified voltage may correspond to 17
18

$\Delta V_{REP}$ multiplied by the gain of the amplifying circuit. Note that, in this example, the gain of the amplifying circuit cancels out in the ratio, resulting in the ratio $\Delta V_{REP\_REF}/\Delta V_{REP}$ given in equation (1).

In certain aspects, the method 1100 may further include amplifying the voltage across the replica switch at the reference supply voltage, the reference temperature, or both using the amplifying circuit to obtain the reference voltage. In certain aspects, amplifying the voltage across the replica switch at the reference supply voltage, the reference temperature, or both to obtain the reference voltage precedes the blocks 1110, 1120, 1130, 1140, and 1150 in FIG. 11. In certain aspects, the voltage across the replica switch used to obtain the reference voltage may be referred to as a first voltage across the replica switch, and the voltage across the replica switch used to obtain the second amplified voltage may be referred to as a second voltage across the replica switch. In these aspects, the first voltage corresponds to a first supply voltage (e.g., the reference supply voltage) and/or a first temperature (e.g., the reference temperature), and the second voltage corresponds to a second supply voltage and/or a second temperature.

Implementation examples are described in the following numbered clauses:

1. A system, comprising:
one or more power switches;
a replica switch;
a current source coupled in series with the replica switch;
a multiplexer having a first input, a second input, a third input, a fourth input, a first output, and a second output, wherein the one or more power switches are coupled between the first input of the multiplexer and the second input of the multiplexer, and the replica switch is coupled between the third input of the multiplexer and the fourth input of the multiplexer;
an amplifying circuit having a first input, a second input, and an output, wherein the first input of the amplifying circuit is coupled to the first output of the multiplexer, and the second input of the amplifying circuit is coupled to the second output of the multiplexer; and
an analog-to-digital converter (ADC) having an input and an output, wherein the input of the ADC is coupled to the output of the amplifying circuit.

2. The system of clause 1, wherein the one or more power switches are coupled between a power grid and a processing core.

3. The system of clause 2, wherein the replica switch is coupled between the power grid and the current source.

4. The system of any one of clauses 1 to 3, wherein, during each one of multiple cycles of a clock signal, the amplifying circuit is configured to:
sample a voltage between the first input of the amplifying circuit and the second input of the amplifying circuit to obtain a sampled voltage;
amplify the sampled voltage to obtain an amplified sampled voltage; and
output the amplified sampled voltage at the output of the amplifying circuit.

5. The system of clause 4, wherein the amplifying circuit comprises a switched-capacitor amplifier.

6. The system of clause 4 or 5, further comprising a control circuit coupled to the multiplexer, wherein the control circuit is configured to:
cause the multiplexer to select the first input of the multiplexer and the second input of the multiplexer during odd cycles of the multiple cycles of the clock signal; and cause the multiplexer to select the third input of the multiplexer and the fourth input of the multiplexer during even cycles of the multiple cycles of the clock signal.

7. The system of clause 4 or 5, further comprising a control circuit coupled to the multiplexer, wherein the control circuit is configured to:
cause the multiplexer to select the first input of the multiplexer and the second input of the multiplexer during even cycles of the multiple cycles of the clock signal; and
cause the multiplexer to select the third input of the multiplexer and the fourth input of the multiplexer during odd cycles of the multiple cycles of the clock signal.

8. The system of clause 4 or 5, wherein the multiple cycles of the clock signal comprise N consecutive cycles of the clock signal, and the system further comprises a control circuit coupled to the multiplexer, wherein the control circuit is configured to:
cause the multiplexer to select the first input of the multiplexer and the second input of the multiplexer during k cycles of the N consecutive cycles of the clock signal, wherein k is equal to or greater than one, and k is less than N; and
cause the multiplexer to select the third input of the multiplexer and the fourth input of the multiplexer during N–k cycles of the N consecutive cycles of the clock signal.

9. The system of clause 8, wherein k is equal to or greater than two.

10. The system of clause 9, wherein N–k is equal to one.

11. The system of any one of clauses 4 to 10, further comprising a control circuit coupled to the multiplexer, wherein the control circuit is configured to:
cause the multiplexer to select the first input of the multiplexer and the second input of the multiplexer during a first one of the multiple cycles of the clock signal; and
cause the multiplexer to select the third input of the multiplexer and the fourth input of the multiplexer during a second one of the multiple cycles of the clock signal.

12. The system of clause 11, wherein the ADC is configured to:
convert the amplified sampled voltage at the output of the amplifying circuit during the first one of the multiple cycles of the clock signal into a first digital signal; and
convert the amplified sampled voltage at the output of the amplifying circuit during the second one of the multiple cycles of the clock signal into a second digital signal.

13. The system of clause 12, further comprising a current processing circuit coupled to the output of the ADC, wherein the current processing circuit is configured to:
determine an estimated current based on the first digital signal;
generate a compensation factor based on the second digital signal, the compensation factor compensating for a change in a resistance of the one or more power switches; and
apply the compensation factor to the estimated current.

14. The system of any one of clauses 1 to 13, wherein the amplifying circuit comprises a switched-capacitor amplifier including an operational amplifier, and the switched-capacitor amplifier is configured to cancel an input offset voltage of the operational amplifier from the output of the amplifying circuit using autozeroing.

15. A method for current sensing, comprising:

amplifying a voltage across one or more power switches using an amplifying circuit to obtain a first amplified voltage;

determining an estimated current based on the first amplified voltage;

amplifying a voltage across a replica switch using the amplifying circuit to obtain a second amplified voltage, wherein the replica switch is coupled in series with a current source;

generating a compensation factor based on the second amplified voltage, the compensation factor compensating for a change in a resistance of the one or more power switches; and applying the compensation factor to the estimated current.

16. The method of clause 15, wherein the one or more power switches are coupled between a power grid and a processing core.

17. The method of clause 16, wherein the replica switch is coupled between the power grid and the current source.

18. The method of any one of clauses 15 to 17, further comprising:

coupling the voltage across the one or more power switches between a first input of the amplifying circuit and a second input of the amplifying circuit during a first cycle of a clock signal; and coupling the voltage across the replica switch between the first input of the amplifying circuit and the second input of the amplifying circuit during a second cycle of the clock signal.

19. The method of clause 18, wherein:

amplifying the voltage across the one or more power switches comprises amplifying the voltage across the one or more power switches using the amplifying circuit during the first cycle of the clock signal; and amplifying the voltage across the replica switch comprises amplifying the voltage across the replica switch using the amplifying circuit during the second cycle of the clock signal.

20. The method of any one of clauses 15 to 19, wherein generating the compensation factor comprises generating the compensation factor based on a ratio of the second amplified voltage and a reference voltage, wherein the reference voltage corresponds to a voltage across the replica switch at a reference supply voltage, a reference temperature, or both.

21. The method of clause 20, further comprising amplifying the voltage across the replica switch at the reference supply voltage, the reference temperature, or both using the amplifying circuit to obtain the reference voltage.

22. An apparatus for current sensing, comprising:

means for amplifying a voltage across one or more power switches to obtain a first amplified voltage;

means for determining an estimated current based on the first amplified voltage;

means for amplifying a voltage across a replica switch to obtain a second amplified voltage, wherein the replica switch is coupled in series with a current source;

means for generating a compensation factor based on the second amplified voltage, the compensation factor compensating for a change in a resistance of the one or more power switches; and means for applying the compensation factor to the estimated current.

23. The apparatus of clause 22, wherein the one or more power switches are coupled between a power grid and a processing core.

24. The apparatus of clause 23, wherein the replica switch is coupled between the power grid and the current source.

25. The apparatus of any one of clauses 22 to 24, wherein:

the means for amplifying the voltage across the one or more power switches comprises means for amplifying the voltage across the one or more power switches during a first cycle of a clock signal; and the means for amplifying the voltage across the replica switch comprises means for amplifying the voltage across the replica switch during a second cycle of the clock signal.

26. The apparatus of any one of clauses 22 to 25, wherein the means for generating the compensation factor comprises means for generating the compensation factor based on a ratio of the second amplified voltage and a reference voltage, wherein the reference voltage corresponds to a voltage across the replica switch at a reference supply voltage, a reference temperature, or both.

27. The apparatus of clause 26, further comprising means for amplifying the voltage across the replica switch at the reference supply voltage, the reference temperature, or both to obtain the reference voltage.

The current processing circuit 280 and the current management circuit 310 may be implemented with a general-purpose processor, a digital signal processor (DSP), an application specific integrated circuit (ASIC), a field programmable gate array (FPGA) or other programmable logic device, a finite state machine, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

The control circuit 290 may be implemented with one or more logic gates, one or more delay elements, and/or one or more frequency dividers that are arranged to receive the clock signal Clk_sw and generate the first control signal $\Phi_1$, the second control signal $\Phi_2$, the third control signal $\Phi_M$, and/or the fourth control signal $\Phi_R$ from the clock signal Clk_sw.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 10 percent of the stated value (i.e., within a range between 90 percent of the stated value and 110 percent of the stated value).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
one or more power switches;
a replica switch;
a current source coupled in series with the replica switch;
a multiplexer having a first input, a second input, a third input, a fourth input, a first output, and a second output, wherein the one or more power switches are coupled between the first input of the multiplexer and the second input of the multiplexer, and the replica switch is coupled between the third input of the multiplexer and the fourth input of the multiplexer;
an amplifying circuit having a first input, a second input, and an output, wherein the first input of the amplifying circuit is coupled to the first output of the multiplexer, and the second input of the amplifying circuit is coupled to the second output of the multiplexer; and
an analog-to-digital converter (ADC) having an input and an output, wherein the input of the ADC is coupled to the output of the amplifying circuit.

2. The system of claim 1, wherein the one or more power switches are coupled between a power grid and a processing core.

3. The system of claim 2, wherein the replica switch is coupled between the power grid and the current source.

4. The system of claim 1, wherein, during each one of multiple cycles of a clock signal, the amplifying circuit is configured to:
sample a voltage between the first input of the amplifying circuit and the second input of the amplifying circuit to obtain a sampled voltage;
amplify the sampled voltage to obtain an amplified sampled voltage; and
output the amplified sampled voltage at the output of the amplifying circuit.

5. The system of claim 4, wherein the amplifying circuit comprises a switched-capacitor amplifier.

6. The system of claim 4, further comprising a control circuit coupled to the multiplexer, wherein the control circuit is configured to:
cause the multiplexer to select the first input of the multiplexer and the second input of the multiplexer during odd cycles of the multiple cycles of the clock signal; and
cause the multiplexer to select the third input of the multiplexer and the fourth input of the multiplexer during even cycles of the multiple cycles of the clock signal.

7. The system of claim 4, further comprising a control circuit coupled to the multiplexer, wherein the control circuit is configured to:
cause the multiplexer to select the first input of the multiplexer and the second input of the multiplexer during even cycles of the multiple cycles of the clock signal; and
cause the multiplexer to select the third input of the multiplexer and the fourth input of the multiplexer during odd cycles of the multiple cycles of the clock signal.

8. The system of claim 4, wherein the multiple cycles of the clock signal comprise N consecutive cycles of the clock signal, and the system further comprises a control circuit coupled to the multiplexer, wherein the control circuit is configured to:
cause the multiplexer to select the first input of the multiplexer and the second input of the multiplexer during k cycles of the N consecutive cycles of the clock signal; and
cause the multiplexer to select the third input of the multiplexer and the fourth input of the multiplexer during N–k cycles of the N consecutive cycles of the clock signal, wherein k is equal to or greater than two, and N–k is equal to one.

9. The system of claim 4, further comprising a control circuit coupled to the multiplexer, wherein the control circuit is configured to:
cause the multiplexer to select the first input of the multiplexer and the second input of the multiplexer during a first one of the multiple cycles of the clock signal; and
cause the multiplexer to select the third input of the multiplexer and the fourth input of the multiplexer during a second one of the multiple cycles of the clock signal.

10. The system of claim 9, wherein the ADC is configured to:
convert the amplified sampled voltage at the output of the amplifying circuit during the first one of the multiple cycles of the clock signal into a first digital signal; and
convert the amplified sampled voltage at the output of the amplifying circuit during the second one of the multiple cycles of the clock signal into a second digital signal.

11. The system of claim 10, further comprising a current processing circuit coupled to the output of the ADC, wherein the current processing circuit is configured to:
determine an estimated current based on the first digital signal;
generate a compensation factor based on the second digital signal, the compensation factor compensating for a change in a resistance of the one or more power switches; and
apply the compensation factor to the estimated current.

12. The system of claim 1, wherein the amplifying circuit comprises a switched-capacitor amplifier including an operational amplifier, and the switched-capacitor amplifier is configured to cancel an input offset voltage of the operational amplifier from the output of the amplifying circuit using autozeroing.

13. A method for current sensing, comprising:
amplifying a voltage across one or more power switches using an amplifying circuit to obtain a first amplified voltage, wherein the one or more power switches are coupled between a power grid and a processing core;
determining an estimated current based on the first amplified voltage;
amplifying a voltage across a replica switch using the amplifying circuit to obtain a second amplified voltage, wherein the replica switch is coupled in series with a current source;
generating a compensation factor based on the second amplified voltage, the compensation factor compensating for a change in a resistance of the one or more power switches; and
applying the compensation factor to the estimated current.

14. The method of claim 13, wherein the replica switch is coupled between the power grid and the current source.

15. The method of claim 13, further comprising:

coupling the voltage across the one or more power switches between a first input of the amplifying circuit and a second input of the amplifying circuit during a first cycle of a clock signal; and coupling the voltage across the replica switch between the first input of the amplifying circuit and the second input of the amplifying circuit during a second cycle of the clock signal.

16. The method of claim 15, wherein:

amplifying the voltage across the one or more power switches comprises amplifying the voltage across the one or more power switches using the amplifying circuit during the first cycle of the clock signal; and amplifying the voltage across the replica switch comprises amplifying the voltage across the replica switch using the amplifying circuit during the second cycle of the clock signal.

17. The method of claim 13, wherein generating the compensation factor comprises generating the compensation factor based on a ratio of the second amplified voltage and a reference voltage, wherein the reference voltage corresponds to a voltage across the replica switch at a reference supply voltage, a reference temperature, or both.

18. The method of claim 17, further comprising amplifying the voltage across the replica switch at the reference supply voltage, the reference temperature, or both using the amplifying circuit to obtain the reference voltage.

19. An apparatus for current sensing, comprising:

means for amplifying a voltage across one or more power switches to obtain a first amplified voltage;

means for determining an estimated current based on the first amplified voltage;

means for amplifying a voltage across a replica switch to obtain a second amplified voltage, wherein the replica switch is coupled in series with a current source;

means for generating a compensation factor based on the second amplified voltage, the compensation factor compensating for a change in a resistance of the one or more power switches; and means for applying the compensation factor to the estimated current.

20. The apparatus of claim 19, wherein the one or more power switches are coupled between a power grid and a processing core.

21. The apparatus of claim 20, wherein the replica switch is coupled between the power grid and the current source.

22. The apparatus of claim 19, wherein:

the means for amplifying the voltage across the one or more power switches comprises means for amplifying the voltage across the one or more power switches during a first cycle of a clock signal; and the means for amplifying the voltage across the replica switch comprises means for amplifying the voltage across the replica switch during a second cycle of the clock signal.

23. The apparatus of claim 19, wherein the means for generating the compensation factor comprises means for generating the compensation factor based on a ratio of the second amplified voltage and a reference voltage, wherein the reference voltage corresponds to a voltage across the replica switch at a reference supply voltage, a reference temperature, or both.

24. The apparatus of claim 23, further comprising means for amplifying the voltage across the replica switch at the reference supply voltage, the reference temperature, or both to obtain the reference voltage.

\* \* \* \* \*